(12) United States Patent
Ford et al.

(10) Patent No.: US 10,367,144 B2
(45) Date of Patent: Jul. 30, 2019

(54) STABLE ORGANIC FIELD-EFFECT TRANSISTORS BY INCORPORATING AN ELECTRON-ACCEPTING MOLECULE

(71) Applicant: The Regents of the University of California, Oakland, CA (US)

(72) Inventors: Michael J. Ford, Santa Barbara, CA (US); Guillermo C. Bazan, Santa Barbara, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 0 days.

(21) Appl. No.: 15/400,579

(22) Filed: Jan. 6, 2017

(65) Prior Publication Data

US 2017/0200894 A1 Jul. 13, 2017

Related U.S. Application Data

(60) Provisional application No. 62/276,145, filed on Jan. 7, 2016.

(51) Int. Cl.
*H01L 27/28* (2006.01)
*H01L 51/05* (2006.01)
*H01L 51/00* (2006.01)

(52) U.S. Cl.
CPC ...... *H01L 51/0036* (2013.01); *H01L 51/0043* (2013.01); *H01L 51/0047* (2013.01);
(Continued)

(58) Field of Classification Search
CPC ............ H01L 51/0036; H01L 51/0047; H01L 51/0043; H01L 51/0558; H01L 27/283; H01L 51/0003; H01L 51/05
(Continued)

(56) References Cited

U.S. PATENT DOCUMENTS 8,624,232 B2 * 1/2014 Sonar ................. H01L 51/0036
257/40
8,765,968 B2 * 7/2014 Chen ..................... B82Y 10/00
548/139
(Continued)

OTHER PUBLICATIONS

Elsevier journal p. 15 synthethic metal by Song et al. (year 2012).*
(Continued)

*Primary Examiner* — Thinh T Nguyen
(74) *Attorney, Agent, or Firm* — Gates & Cooper LLP

(57) ABSTRACT

The present disclosure demonstrates that the introduction of electron deficient fullerene acceptors into thin films comprised of the high-mobility semiconducting polymers suppresses an undesirable "double-slope" in the current-voltage characteristics, improves operational stability, and changes ambipolar transport to unipolar transport. Examination of a variety of high μ polymers shows general applicability. The present disclosure also shows that instability is further reduced by tuning the relative electron affinity of the polymer and fullerene by creating blends containing different fullerene derivatives and semiconductor polymers. One can obtain hole μ values up to 5.6 cm$^2$ V$^{-1}$ s$^{-1}$ that are remarkably stable over multiple bias-sweeping cycles. The results provide a simple, solution-processable route to dictate transport properties and improve semiconductor performance in systems that display similar non-idealities.

20 Claims, 25 Drawing Sheets

(52) U.S. Cl.
CPC ........ *H01L 51/0566* (2013.01); *H01L 27/283* (2013.01); *H01L 51/0003* (2013.01); *H01L 51/0533* (2013.01); *H01L 51/0541* (2013.01)

(58) Field of Classification Search
USPC .......... 257/40, 642, 643, E39.007, 344, 351; 438/82, 99
See application file for complete search history.

(56) References Cited

U.S. PATENT DOCUMENTS

| | | | | |
|---|---|---|---|---|
| 8,878,165 | B2* | 11/2014 | Miskiewicz | ........ H01L 51/0071 257/40 |
| 2011/0156018 | A1* | 6/2011 | Moriwaki | .............. B82Y 30/00 257/40 |
| 2011/0315967 | A1* | 12/2011 | Schmidhalter | ......... H01B 1/127 257/40 |
| 2012/0156829 | A1* | 6/2012 | Chen | ...................... B82Y 10/00 438/99 |
| 2012/0319097 | A1* | 12/2012 | Miskiewicz | ........ H01L 51/0071 257/40 |
| 2013/0277658 | A1* | 10/2013 | Bazan | ................. H01L 51/0043 257/40 |
| 2015/0214486 | A1* | 7/2015 | Tseng | ................. H01L 51/0012 257/40 |
| 2017/0002125 | A1* | 1/2017 | Xiao | ..................... C08F 228/06 |

OTHER PUBLICATIONS

Fullerene Additives Convert Ambipolar Transport to p-Type Transport while Improving the Operational Stability of Organic Thin Film Transistors, by Michael J. Ford, Ming Wang, Hung Phan, Thuc-Quyen Nguyen, and Guillermo Bazan, Advanced Functional Materials, vol. 26, Issue 25, Jul. 5, 2016, p. 4616.

"Supporting Information" for reference 22 entitled, Fullerene Additives Convert Ambipolar to p-Type Transport while Increasing the Operational Stability of Organic Thin Film Transistors, by Michael J. Ford, Ming Wang, Hung Phan, Thuc-Quyen Nguyen, Guillermo C. Bazan.

Ying, L., et al., "Regioregular Pyridal[2,1,3]thiadiazole π-Conjugated Copolymers", Journal of American Chemical Society, ACS Publications, 2011, pp. 18538-18541, vol. 133.

Tseng, H-R., et al., "High Mobility Field Effect Transistors Based on Macroscopically Oriented Regioregular Copolymers", ACS Publications, American Chemical Society—Nano Letters, 2012, pp. 6353-6357, vol. 12.

Tseng, H-R., et al., "High-Mobility Field-Effect Transistors Fabricated with Macroscopic Aligned Semiconducting Polymers", Advanced Materials, 2014, pp. 2993-2998, vol. 26.

Ford, M.J., et al., "High Mobility Organic Field-Effect Transistors from Majority Insulator Blends", ACS Publications, American Chemical Society—Chemistry of Materials, 2016, pp. 1256-1260, vol. 28.

Sirringhaus, H., "25th Anniversary Article: Organic Field-Effect Transistors: The Path Beyond Amorphous Silicon", Advanced Materials, 2014, pp. 1319-1335, vol. 26.

Bartelt, J.A., et al., "The Importance of Fullerene Percolation in the MixedRegions of Polymer—Fullerene Bulk Heterojunction Solar Cells", Advanced Energy Materials, 2013, pp. 364-374, vol. 3.

Köler, A., "Organic Semiconductors—No more breaks for electrons", Nature Materials, Oct. 2012, pp. 836-837, vol. 11.

Facchetti, A., "Organic Semiconductors—Made to order", Nature Materials, Jul. 2013, pp. 598-600, vol. 12.

Ford, M.J., et al., "Fullerene Additives Convert Ambipolar Transport to p-Type Transport while Improving the Operational Stability of Organic Thin Film Transistors", Advanced Functional Materials, 2016, pp. 4472-4480, vol. 26.

Luo, C., et al., "General Strategy for Self-Assembly of Highly Oriented Nanocrystalline Semiconducting Polymers with High Mobility", ACS Publications, American Chemical Society, Nano Letters, 2014, pp. 2764-2771, vol. 14.

* cited by examiner ated U.S. Provisional Patent Application No. 62/207,707, filed Aug. 20, 2015, by Michael Ford and Guillermo Bazan, entitled "HIGH MOBILITY POLYMER ORGANIC FIELD-EFFECT TRANSISTORS BY BLADE-COATING SEMICONDUCTOR: INSULATOR BLEND SOLUTIONS," and U.S. Provisional Patent Application No. 62/262,025, filed Dec. 2, 2015, by Michael Ford and Guillermo Bazan, entitled "HIGH MOBILITY POLYMER ORGANIC FIELD-EFFECT TRANSISTORS BY BLADE-COATING SEMICONDUCTOR: INSULATOR BLEND SOLUTIONS,"

STABLE ORGANIC FIELD-EFFECT TRANSISTORS BY INCORPORATING AN ELECTRON-ACCEPTING MOLECULE

CROSS REFERENCE TO RELATED APPLICATIONS

This application claims the benefit under 35 U.S.C. Section 119(e) and commonly-assigned U.S. Provisional Patent Application No. 62/276,145, filed Jan. 7, 2016, by Michael J. Ford and Guillermo Bazan, entitled "STABLE ORGANIC FIELD-EFFECT TRANSISTORS BY INCORPORATING AN ELECTRON-ACCEPTING MOLECULE,"

which application is incorporated by reference herein.

This application is related to the following co-pending and commonly-assigned U.S. patent applications:

U.S. Provisional Patent Application No. 62/338,866, filed May 19, 2016, by Michael J. Ford, Hengbin Wang, and Guillermo Bazan, entitled "ORGANIC SEMICONDUCTOR SOLUTION BLENDS FOR SWITCHING AMBIPOLAR TRANSPORT TO N-TYPE TRANSPORT,"

U.S. Provisional Patent Application No. 62/327,311, filed Apr. 25, 2016, by Guillermo Bazan and Ming Wang, entitled "NOVEL WEAK DONOR-ACCEPTOR CONJUGATED COPOLYMERS FOR FIELD-EFFECT TRANSISTOR APPLICATIONS,"

U.S. Utility patent application Ser. No. 15/349,920, filed Nov. 11, 2016, by Ming Wang and Guillermo Bazan, entitled "FLUORINE SUBSTITUTION INFLUENCE ON BENZO [2,1,3]THIODIAZOLE BASED POLYMERS FOR FIELD-EFFECT TRANSISTOR APPLICATIONS," which application claims the benefit under 35 U.S.C. Section 119(e) of U.S. Provisional Patent Application No. 62/253,975, filed Nov. 11, 2015, by Ming Wang and Guillermo Bazan, entitled "FLUORINE SUBSTITUTION INFLUENCE ON BENZO [2,1,3]THIODIAZOLE BASED POLYMERS FOR FIELD-EFFECT TRANSISTOR APPLICATIONS,"

U.S. Utility patent application Ser. No. 15/349,920, filed Nov. 11, 2016, by Byoung Hoon Lee, Ben B. Y. Hsu, Chan Luo, Ming Wang, Guillermo Bazan, and Alan J. Heeger, entitled "SEMICONDUCTING POLYMERS WITH MOBILITY APPROACHING ONE HUNDRED SQUARE CENTIMETERS PER VOLT PER SECOND," which application claims the benefit under 35 U.S.C. Section 119(e) of U.S. Provisional Patent Application No. 62/263,058, filed Dec. 4, 2015, by Byoung Hoon Lee, Ben B. Y. Hsu, Chan Luo, Ming Wang, Guillermo Bazan, and Alan J. Heeger, entitled "SEMICONDUCTING POLYMERS WITH MOBILITY APPROACHING ONE HUNDRED SQUARE CENTIMETERS PER VOLT PER SECOND,"

U.S. Utility patent application Ser. No. 15/256,160, filed Sep. 2, 2016, by Byoung Hoon Lee and Alan J. Heeger, entitled "DOPING-INDUCED CARRIER DENSITY MODULATION IN POLYMER FIELD-EFFECT TRANSISTORS," which application claims the benefit under 35 U.S.C. Section 119(e) and commonly-assigned U.S. Provisional Patent Application No. 62/214,076, filed Sep. 3, 2015, by Byoung Hoon Lee and Alan J. Heeger, entitled "DOPING-INDUCED CARRIER DENSITY MODULATION IN POLYMER FIELD-EFFECT TRANSISTORS,"

U.S. Utility patent application Ser. No. 15/241,949 filed Aug. 19, 2016, by Michael Ford and Guillermo Bazan, entitled "HIGH MOBILITY POLYMER ORGANIC FIELD-EFFECT TRANSISTORS BY BLADE-COATING SEMICONDUCTOR: INSULATOR BLEND SOLUTIONS," which application claims the benefit under 35 U.S.C. Section 119(e) of U.S. Provisional Patent Application U.S. Utility application Ser. No. 15/213,029 filed on Jul. 18, 2016 by Byoung Hoon Lee and Alan J. Heeger, entitled "FLEXIBLE ORGANIC TRANSISTORS WITH CONTROLLED NANOMORPHOLOGY", which application claims the benefit under 35 U.S.C. Section 119(e) of U.S. Utility U.S. Provisional Application Ser. No. 62/193,909 filed on Jul. 17, 2015 by Byoung Hoon Lee and Alan J. Heeger, entitled "FLEXIBLE ORGANIC TRANSISTORS WITH CONTROLLED NANOMORPHOLOGY", U.S. Utility patent application Ser. No. 15/058,994, filed Mar. 2, 2016, by Shrayesh N. Patel, Edward J. Kramer, Michael L. Chabinyc, Chan Luo and Alan J. Heeger, entitled "BLADE COATING ON NANOGROOVED SUBSTRATES YIELDING ALIGNED THIN FILMS OF HIGH MOBILITY SEMICONDUCTING POLYMERS," which application claims the benefit under 35 U.S.C. Section 119(e) of U.S. Provisional Patent Application No. 62/127, 116, filed Mar. 2, 2015, by Shrayesh N. Patel, Edward J. Kramer, Michael L. Chabinyc, Chan Luo and Alan J. Heeger, entitled "BLADE COATING ON NANO-GROOVED SUBSTRATES YIELDING ALIGNED THIN FILMS OF HIGH MOBILITY SEMICONDUCTING POLYMERS,"

U.S. Utility patent application Ser. No. 14/585,653, filed on Dec. 30, 2014, by Chan Luo and Alan Heeger, entitled "HIGH MOBILITY POLYMER THIN FILM TRANSISTORS WITH CAPILLARITY MEDIATED SELF-ASSEMBLY", which application claims the benefit under 35 U.S.C. Section 119(e) of U.S. Provisional Patent Application Ser. No. 61/923,452, filed on Jan. 3, 2014, entitled "HIGH MOBILITY POLYMER THIN FILM TRANSISTORS WITH CAPILLARITY MEDIATED SELF-ASSEMBLY,"

U.S. Utility patent application Ser. No. 14/426,467, filed on Mar. 6, 2015, by Hsing-Rong Tseng, Lei Ying, Ben B. Y. Hsu, Christopher J. Takacs, and Guillermo C. Bazan, entitled "FIELD-EFFECT TRANSISTORS BASED ON MACROSCOPICALLY ORIENTED POLYMERS," which application claims the benefit under 35 U.S.C. § 365 of PCT International patent application serial no. PCT/US13/ 058546 filed Sep. 6, 2013, which application claims the benefit under 35 U.S.C. Section 119(e) of U.S. Provisional Patent Application Ser. Nos. 61/698,065, filed on Sep. 7, 2012, and 61/863,255, filed on Aug. 7, 2013, entitled "FIELD-EFFECT TRANSISTORS BASED ON MACROSCOPICALLY ORIENTED POLYMERS,"; and U.S. Utility patent application Ser. No. 13/526,371, filed on Jun. 18, 2012, by G.

Bazan, L. Ying, B. Hsu, W. Wen, H-R Tseng, and G. Welch entitled "REGIOREGULAR PYRIDAL[2,1,3] THIADIAZOLE PI-CONJUGATED COPOLYMERS FOR ORGANIC SEMICONDUCTORS" which application claims priority under 35 U.S.C. § 119(e) to U.S. Provisional Patent Application Ser. No. 61/498,390, filed on Jun. 17, 2011, by G. Bazan, L. Ying, B. Hsu, and G. Welch entitled "REGIOREGULAR CONSTRUCTIONS FOR THE SYNTHESIS OF THIADIAZOLO (3,4) PYRIDINE CONTAINING NARROW BAND GAP CONJUGATED POLY- MERS" and U.S. Provisional Patent Application Ser. No. 61/645,970, filed on May 11, 2012, by G. Bazan, L. Ying, and Wen, entitled "REGIOREGULAR PYRIDAL[2,1,3] THIADIAZOLE PI-CONJUGATED COPOLYMERS FOR ORGANIC SEMICONDUCTORS"

all of which applications are incorporated by reference herein.

BACKGROUND OF THE INVENTION

1. Field of the Invention

This invention relates to methods and compositions for improving stability of Organic Field Effect Transistors (OFETs).

2. Description of the Related Art (Note: This application references a number of different references as indicated throughout the specification by one or more reference numbers in bracketed superscripts, e.g.,[x]. A list of these different references ordered according to these reference numbers can be found below in the section entitled "References." Each of these references is incorporated by reference herein.)

Electronic devices driven by polymeric semiconductors are a promising future technology, with the potential to be compatible with large-area production on flexible substrates and low-temperature solution processing. Molecular design and device engineering has led to improved performance over the past 25 years.[1,2] However, many high mobility active layers within field-effect transistor configurations exhibit deviations from ideality and current-voltage characteristics that drift over multiple scans (i.e., operational instability.) In particular deviations from expected linearity in current-voltage characteristics may occur[3-5] along with changes in mobility, on/off ratio, and threshold voltage after typical device operation.[6,7] These factors make it difficult for polymer semiconductors to be implemented as the current driving material in electronic circuits and also convolute intrinsic charge carrier properties.

SUMMARY OF THE INVENTION

The present disclosure reports on the unexpected and surprising demonstration that the introduction of an electron deficient fullerene acceptor, such as $C_{60}$ or $PC_{61}BM$ (commonly used in organic solar cell devices [30]), to a high-mobility p-type semiconducting polymer (e.g., PCDTPT or PCDTFBT) in a device, suppresses operational instability, normalizes device characteristics, and alternates ambipolar transport to unipolar transport in the device.

For example, the present disclosure describes one or more organic field effect transistors (OFETs), the OFETs each comprising a source contact to a p-type channel, wherein the p-type channel comprises one or more semiconducting polymers combined with one or more electron acceptors; a drain contact to the p-type channel; and a dielectric between a gate contact and the p-type channel.

Embodiments of the OFET implementation include, but are not limited to, the following.

1. OFETs wherein the electron acceptors are current stabilizing agents in the p-type channel.

2. OFETs of any of the preceding embodiments wherein the semiconducting polymers comprise polymer chains each comprising (e.g., regioregular) donor-acceptor repeating units.

3. OFETs of any of the preceding embodiments wherein the semiconducting polymers are ambipolar semiconducting polymers.

4. OFETs of any of the preceding embodiments, wherein each of the electron acceptors are a fullerene (e.g., $PC_{61}BM$, $PC_{71}BM$, $C_{60}$), N2200, an N2200 derivative, naphthalene diimide (NDI), an NDI derivative, perylene diimide (PDI), or a PDI derivative.

5. OFETs of any of the preceding embodiments, wherein each of the OFETs further comprise a film comprising the p-type current transport region that is cast from a solution comprising the fullerenes/electron acceptors and the semiconducting polymers, and wherein a weight ratio of the fullerenes/electron acceptors in the solution or the film is in a range of 1%-95% wt. %, and weight ratio or wt. % is defined as (weight of the electron acceptor/total weight of the polymer and the electron acceptor)×100.

6. The OFETs of preceding embodiment 5, wherein any concentration of the blend (of the electron acceptor/fullerene and the polymer) in the solution is used. Examples of blend concentrations include, but are not limited to, a concentration in a range of 0.5 mg/mL to 1000 mg/mL, wherein the milligrams (mg) represents the total weight of the polymer and the electron acceptor/fullerene additive, and the milliliter (mL) represents the volume of the solution. For example, the fullerene/electron acceptor can comprise 1% to 95% of the total weight of the blend in the solution (e.g., wherein the rest of the 5 mg is composed of the polymer in the case of a 5 mg/mL concentration solution, however other concentrations can also be used).

7. The OFETs of any of the preceding embodiments, wherein each of the OFETs each comprise a film comprising the p-type channel, the fullerenes are phase separated in the film, and the semiconducting polymer includes a plurality of interconnected polymer chains.

8. the OFETs of any of the preceding embodiments having increased threshold voltage stability and characterized by a current voltage curve having increased cycling stability.

9. The OFETs of any of the preceding embodiments, further comprising a first amount and a first composition of the semiconducting polymers; a second amount and a second composition of the electron acceptors; wherein each of the OFETs are characterized by having a curve plotting $(I_d)^{1/2}$ as a function of gate voltage $(V_g)$, the curve having a single slope for $V_g$ in a range of 10 V to −60 V.

10. The OFETs of any of the preceding embodiments, further comprising a first amount and a first composition of the semiconducting polymers; a second amount and a second composition of the electron acceptors; wherein each of the OFETs are characterized by their drain-source current $(I_{ds})$ for a given gate voltage $(V_g)$ changing by 10% or less after 20 sweeps of the $V_g$ in a range of 10 V to −60 V.

11. The OFETs of any of the preceding embodiments, further comprising a first amount and a first composition of the semiconducting polymers; a second amount and a second composition of the electron acceptors; and wherein each of the OFETs have a mobility in a saturation regime of at least 2 $cm^2$ $V^{-1}$ $s^{-1}$.

12. The OFETs of any of the preceding embodiments, further comprising a first amount and a first composition of the semiconducting polymers; a second amount and a second composition of the electron acceptors; wherein the OFETs have the mobility in a saturation regime that is not reduced by more than 30% after 20 sweeps of the gate voltage in a range of 10 V to −60 V.

13. The OFETs of any of the preceding embodiments, further comprising a first amount and a first composition of the semiconducting polymers; a second amount and a second composition of the electron acceptors; wherein the OFETs have a threshold voltage that does not shift by more than 1 Volt after the 20 sweeps of the gate voltage in a range of 10 V to −60 V.

14. The OFETs of any of the preceding embodiments, wherein the semiconducting polymers each comprise a regioregular conjugated main chain section, said regioregular conjugated main chain section having a repeat unit that comprises a compound of the structure:

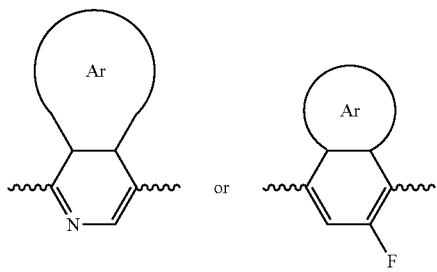

wherein:

Ar is a substituted or non-substituted aromatic functional group or Ar is nothing and the valence of the pyridine or fluorinated ring is completed with hydrogen; the pyridine or the fluorinated ring is regioregularly arranged along the conjugated main chain section; and the compound is bonded, in the repeat unit, to a dithiophene of the structure:

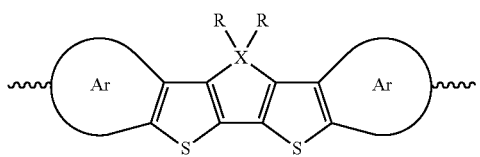

wherein each R is independently hydrogen or a substituted or non-substituted alkyl, aryl or alkoxy chain; and X is C, Si, Ge, N or P.

15. The OFETs of any of the preceding embodiments, wherein the semiconducting polymers are poly[4-(4,4-dihexadecyl-4H-cyclopenta[1,2-b:5,4-b']dithiophen-2yl)-alt-[1,2,5]thiadiazolo[3,4-c]pyridine] (PCDTPT), or poly[5-fluoro-[2,1,3]benzothiadiazole-4,7-diyl(4,4-dihexadecyl-4H-cyclopenta[2,1-b:3,4-b']dithiophene-2, 6-diyl)-5-fluoro-[2,1,3]benzothiadiazole-7,4-diyl(4,4-dihexadecyl-4H-cyclopenta[2,1-b:3,4-b'] (PCDTFBT).

16. An electronic circuit comprising the OFETs of any of the preceding embodiments.

The present disclosure further discloses a composition of matter useful as a current transport region in an organic semiconductor device, the composition of matter comprising an ambipolar semiconducting polymer; and means for accepting electrons from the ambipolar semiconducting polymer. In one or more embodiments, the means increase threshold voltage stability and/or reduce hysteresis in a current voltage curve of an OFET comprising a channel including the current transport region. In one example, the OFET comprising the current transport region is characterized by having a drain-source current ($I_{ds}$) for a given gate voltage ($V_g$) changing by 10% or less after 20 sweeps of the $V_g$ in a range of 10 V to −60 V.

The present invention further discloses a method of fabricating an OFET including forming a source contact and a drain contact to a film comprising a semiconducting polymer and a current stabilizing and/or threshold voltage stabilizing effective amount of a fullerene or an electron accepting compound; and forming a gate connection on a dielectric, wherein the gate connection applies a field to the semiconducting polymer across the dielectric to modulate conduction along the semiconducting polymer in a channel between the source contact and the drain contact. In one or more embodiments, an amount of the electron-accepting compound is controlled in order to control and obtain a desired threshold voltage, mobility, ideality, and stability (including cycling stability and stability over time) of the OFET.

Examination of the addition of fullerenes to a plurality of different conjugated polymer organic field-effect transistors (OFETs) shows that this approach has general applicability. The results achieved by embodiments of the present invention provide a simple, solution-processable route to improve p-type OFETs and could be implemented in a range of systems that display similar non-idealities.

BRIEF DESCRIPTION OF THE DRAWINGS

Referring now to the drawings in which like reference numbers represent corresponding parts throughout:

FIGS. 11a-11l illustrate examples of semiconducting polymers that may be combined with electron accepting compounds according to one or more embodiments of the present invention.

DETAILED DESCRIPTION OF THE INVENTION

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

Technical Description

Figure 1B:
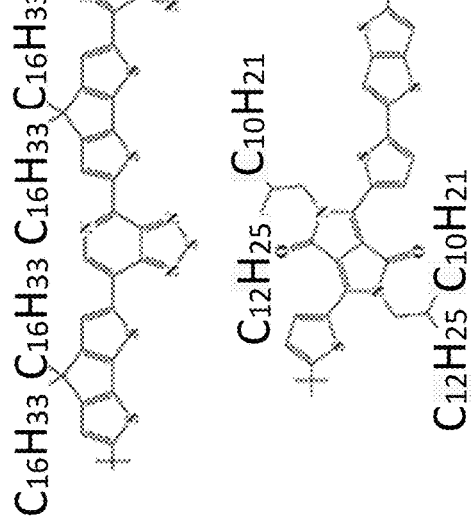
FIG. 1b shows the PCDTPT structure (top) and the DT-PDPP2T-TT structure (bottom).
Figure 1A:
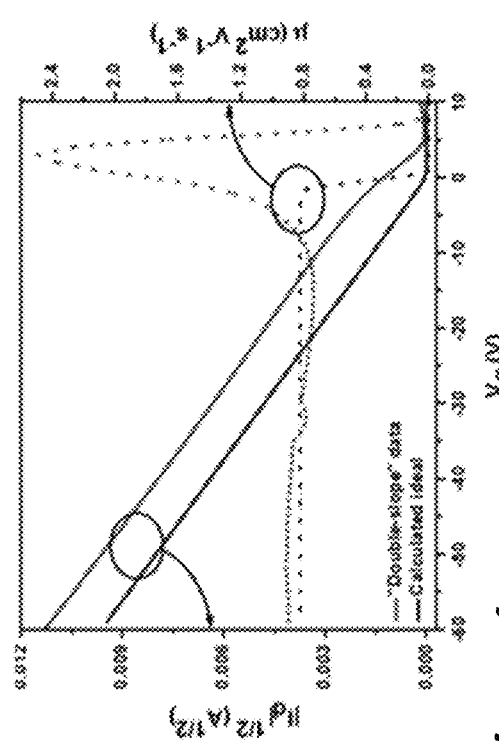
FIG. 1a shows an illustrative example of the double-slope behavior for an OFET comprising PCDTPT ("double-slope" data) and a calculated plot ("calculated ideal") using the saturation regime equation as an example of ideal dependence (solid lines correspond to the $I_{ds}^{1/2}$ dependence on $V_g$ and dotted lines correspond to the µ dependence on $V_g$).

In several polymer and small molecule systems, field-effect charge carrier mobilities exceeding 1 $cm^2 V^{-1} s^{-1}$ have been reported.[3-5,8-10] However, in many cases, how to calculate mobility may be a subject of debate. The reason for these uncertainties is illustrated in FIG. 1a and explained below. The slope of the square root of the drain current ($I_d$) versus gate voltage ($V_g$) is commonly used to calculate the saturation regime field-effect mobility (μ) and in an ideal case should be monotonic across all $V_g$. The dependence of μ on channel width (W), channel length (L), channel capacitance ($C_i$), and threshold voltage ($V_T$), is given by $$I_d = \mu \times W/2L \times C_i \times (V_g - V_T)^2.$$

In some reported polymer semiconductors, the dependence of $I_d^{1/2}$ vs. $V_g$ has been observed to increase with increasing magnitude of $V_g$.[11] In other cases, the opposite occurs; a larger slope is observed at low $V_g$ and decreases at high $V_g$,[12-14] see also Supporting Information[23]. FIG. 1a illustrates this so-called "double-slope" by plotting $I_d^{1/2}$ vs. $V_g$ next to a calculation of an ideal, single-slope curve to illustrate the phenomenon. For the double-slope, μ is higher at small absolute $V_g$ and decreases at larger absolute $V_g$ whereas the ideal case shows μ being independent of $V_g$ once the device is on. It therefore can be unclear how to calculate μ for a particular organic semiconductor, which prevents developing general structure-electronic property relationships.

The cause of the double-slope remains under debate (and may not be universal for all high mobility organic semiconductors) but has been commonly observed in recent years (see Supporting Information.) Charge conduction in the bulk, rather than near the dielectric interface, contact resistance effects, and charge interaction into the dielectric layer have all been cited as possible causes of the double-slope.[3] In addition to deviations from ideality, changes in device characteristics through normal device operation are undesirable for commercial application. For example, μ should be constant after multiple scans so that the measured current at a particular voltage does not change, $V_T$ should remain fairly constant during device operation (i.e., a device should not be ON at a particular voltage and then switch to OFF at the same voltage solely due to operational stresses), and the on/off ratio ($I_{ON}/I_{OFF}$) should remain high to give well-defined ON and OFF states. Discovering methods that circumvent complications due to unstable transport are needed to enable implementation of organic semiconductors in solution-processed electronics.

PCDTPT, DT-PDPPTT-DT, PCDTFBT, or a blend comprising a fullerene additive and the PCDTPT, DT-PDPPTT- DT, PCDTFBT was blade-coated as the active layer in bottom-gate bottom-contact OFETs with DTS-treated $SiO_2$ (300 nm) as the dielectric, and Ni/Au (5/50 nm) as the source/drain contacts. The structure obtained was annealed at 200° C.

1. First Example: PCDTPT

FIG. 1a illustrates high p-type $\mu$ in the copolymer PCDTPT where the double-slope could be observed under certain conditions (see also[15,19]). More recently, a possible cause of the double-slope observed in PCDTPT has been proposed, whereby electron injection correlates with non-idealities.[20] Of particular interest to us was to examine if it is possible to suppress the double-slope while maintaining high $\mu$. As described below, the addition of $PC_{61}BM$ nearly eliminates non-ideal behavior, which maintaining high p-type $\mu$ across a wide range of PCDTPT/$PC_{61}BM$ compositions.

a. Pristine PCDTPT

Figure 1D:
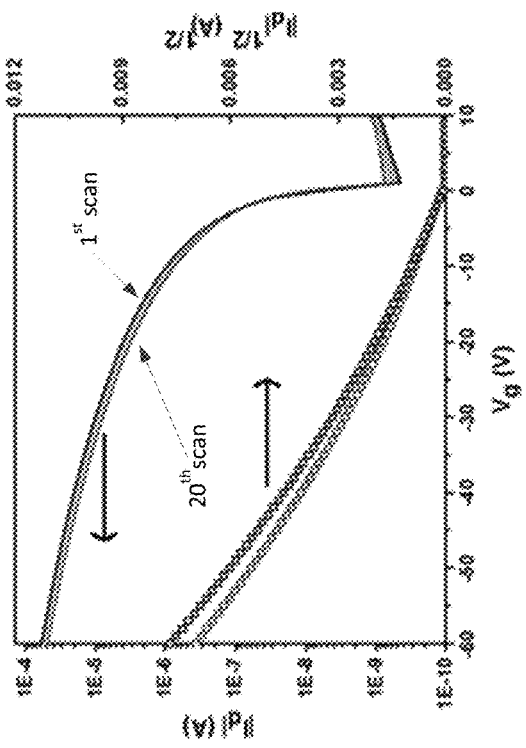
FIG. 1d shows 20-scan transfer curves for and OFET comprising 95:5 wt. % PCDTPT:$PC_{61}$BM, showing the first scan and the $20^{th}$ scan, according to one or more embodiments of the present invention.
Figure 1C:
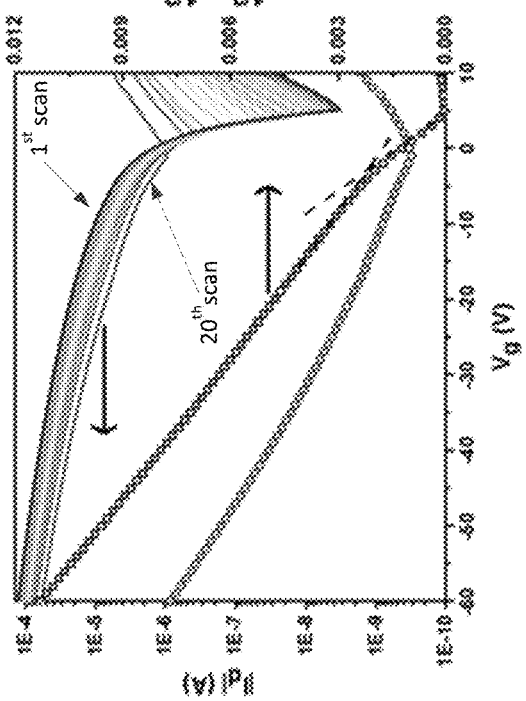
FIG. 1c shows a 20-scan transfer curves for an OFET comprising pristine PCDTPT for the first scan and the $20^{th}$ scan.

FIG. 1a and FIG. 1c illustrate device instability and non-idealities in PCDTPT (at least 8 devices were tested on multiple substrates).

The first scan of the transfer characteristics displays qualities of ambipolarity. This can also be observed in the output characteristic where current saturation is not observed at high source-drain voltages (Supplementary Figure S1[23]).

Devices exhibited an average $\mu=0.57\pm0.06$ cm$^2$ V$^{-1}$ s$^{-1}$ (extracted from $V_g=-30$ V to $-50$ V), $V_T$ ranging from $-5.9$ to 10.7 V, and $I_{ON}/I_{OFF}$ less than 120 (the first scan of the devices never reaches a well-defined OFF state due to electron injection; therefore, calculations of $I_{ON}/I_{OFF}$ used the maximum and minimum current from the scan).

Device instability was subsequently examined through device cycling (FIG. 1c). FIG. 1c shows the forward scan transfer characteristics of a PCDTPT OFET was subjected to 20 cycles of bias sweeping of $V_g$ from 10 V to $-60$ V forwards and backwards at a source-drain voltage ($V_d$) of $-80$ V. After 20 scans/cycles:

the average $\mu$ (when extracted from a $V_g$ region of $-30$ to $-50$ V) has increased to $1.00\pm0.05$ cm$^2$ V$^{-1}$ s$^{-1}$;

$I_{ON}/I_{OFF}$ is as high as approximately 40,000 due to a slight increase in the on current at $V_g=-60$ V and a significant decrease in the region where electron injection was previously observed at $V_g=10$ V.

In addition to changes in device performance, deviations from the ideal current-voltage characteristics were observed after 20 scans. The double-slope issue previously discussed was observed, and an average $\mu$ as high as $3.2\pm0.5$ cm$^2$ V$^{-1}$ s$^{-1}$ is extracted from a narrow, low $V_g$ regime between $V_g=10$ V to $-5$ V.

b. PCDTPT: $PC_{61}BM$ Blend

Since ambipolar transport (in particular, electron injection) in PCDTPT has been implicated as a possible cause of the deviation from ideality, the inventors of the present invention hypothesized that a suitable electron acceptor in the channel may perturb device characteristics. Accordingly, $PC_{61}BM$ was added in solution at varying weight concentrations from 99.9:0.1 wt. % PCDTPT:$PC_{61}BM$ to 5:95 wt. % PCDTPT:$PC_{61}BM$.

FIG. 1d illustrates device performance for a device example using 95:5 wt. % PCDTPT:$PC_{61}BM$ (devices were fabricated and tested under identical conditions as described above for the pristine PCDTPT devices). PCDTPT:$PC_{61}BM$ devices exhibited an average $\mu=0.50\pm0.03$ cm$^2$ V$^{-1}$ s$^{-1}$, $V_T$ ranging from $-10.5$ to $-6.1$ V, and $I_{ON}/I_{OFF}$ of about $1.8\times 10^5$. Of particular relevance, electron injection is suppressed in the transfer characteristics, with $I_{OFF}$ decreased by about 3 orders of magnitude, as compared to pristine PCDTPT devices. The output characteristics also demonstrate improved saturation (Supplementary Figures S2-S4[23]). Regression analysis of the output curves shows improved fits for $\mu$ values calculated from the $PC_{61}BM$-containing devices compared to the fit obtained using the high value $\mu$ obtained in the pristine PCDTPT device (Supplementary Figures S5-S7[23]).

The 95:5 wt. % PCDTPT:$PC_{61}BM$ blend device was subjected to the device cycling outlined above. After 20 scans, the average $\mu=0.57\pm0.06$ cm$^2$ V$^{-1}$ s$^{-1}$, the maximum $I_{ON}/I_{OFF}$ is 550000, and notably, the double-slope was not observed. Thus, remarkably, p-type characteristics and stability are improved by the addition of $PC_{61}BM$.

Figure 1E:
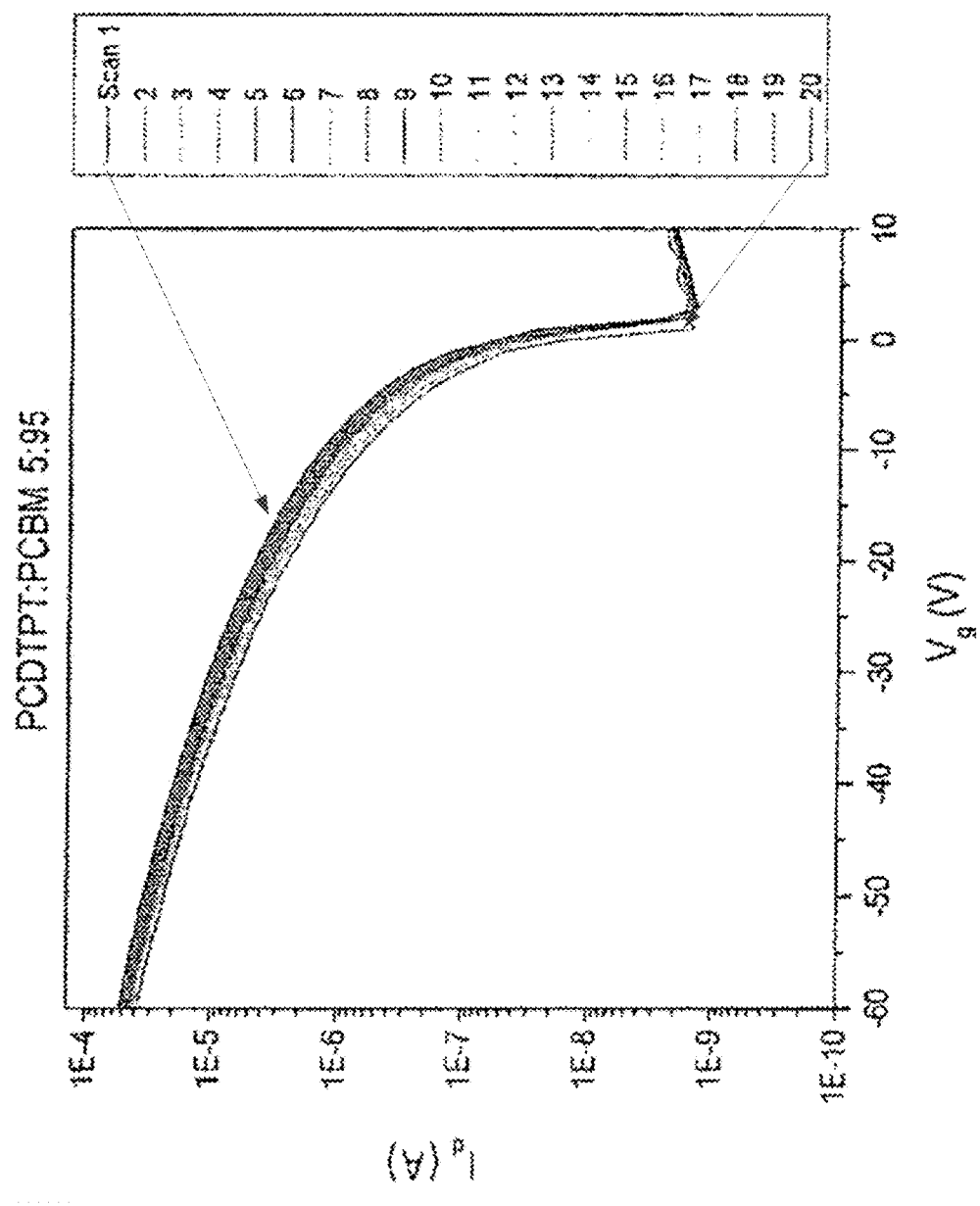
FIG. 1e shows 20-scan transfer curves for and OFET comprising 5:95 wt. % PCDTPT:$PC_{61}$BM, showing the first scan and the $20^{th}$ scan, according to one or more embodiments of the present invention.
Figure 2B:
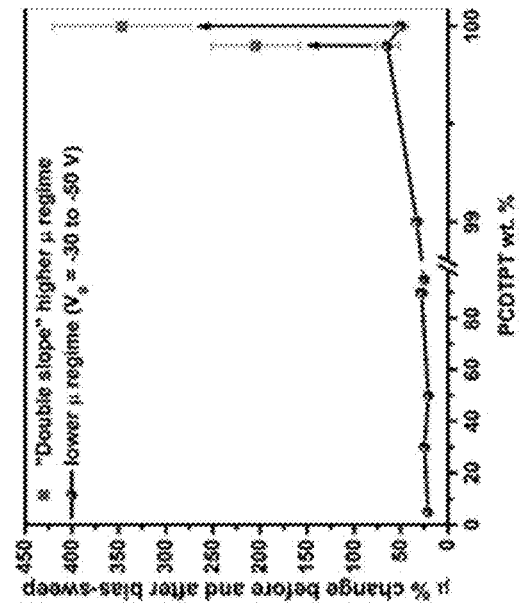
FIG. 2b shows the mobility (µ) percent change as a function of fullerene wt. % according to one or more embodiments of the present invention, wherein µ from the low absolute $V_g$ (i.e., the higher slope in the observed double-slope) was also considered (dashed line).
Figure 2A:
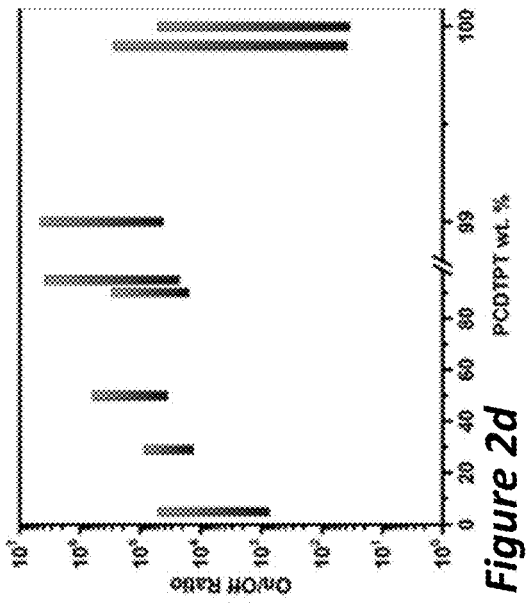
FIG. 2a shows the mobility for devices with and without alignment by nanogrooves, as a function of fullerene wt. % according to one or more embodiments of the present invention, according to one or more embodiments of the present invention.

FIGS. 2a-2d illustrate the effects of varying $PC_{61}BM$ content. FIG. 2a shows $\mu$ as a function of PCDTPT composition (1' scan) and shows there is negligible dependence of $\mu$ on composition. Remarkably, even a 5:95 wt. % PCDTPT:$PC_{61}BM$ solution of PCDTPT can produce a working OFET that does not sacrifice $\mu$, indicating that the internal morphology of the film is appropriate for hole transport and implying a strong driving force for phase separation between PCDTPT and $PC_{61}BM$ (see FIG. 1e illustrating device performance for a device example using 5:95 wt. % PCDTPT:$PC_{61}BM$).

FIG. 2b shows the percent change in $\mu$ between the 1$^{st}$ scan and the 20$^{th}$ scan, averaged for 8 devices. A small percent change is desirable. Indeed, the average $\mu$ percent change after 20 scans does not exceed 27% for any composition of 95:5 wt. % PCDTPT:$PC_{61}BM$ and below, and no double-slope is observed after 20 scans. The double-slope is observed for concentrations greater than or equal to 99:1 wt. % PCDTPT:$PC_{61}BM$. For pristine PCDTPT, the average $\mu$ percent change is 52% when mobility is calculated from the lower-$\mu$ regime of the double-slope (i.e., between $V_g=-30$ V to $-50$ V). When calculating $\mu$ in the higher-$\mu$ regime (i.e., between $V_g=10$ V to $-5$ V), $\mu$ changes by more than 300% (as compared to the first scan). Not only is such a drastic change in $\mu$ incompatible with industrial quality control standards, but the increase in $\mu$ is also transient. After the device is left off for a short period of time, current-voltage characteristics begin to return to the initial scan characteristics (Supplementary Figure S9[23]).

Figure 2D:
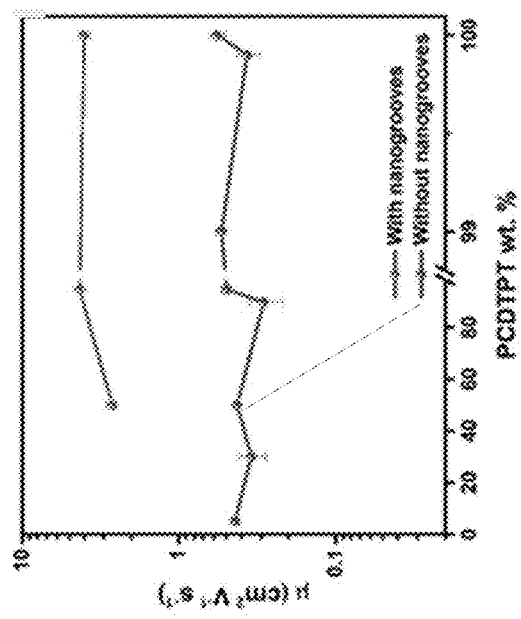
FIG. 2d shows the range of measured $I_{ON}/I_{OFF}$ as a function of fullerene wt. % according to one or more embodiments of the present invention, wherein at least 8 devices were measured and scanned 20 times each, and the 95% confidence limit is shown.
Figure 2C:
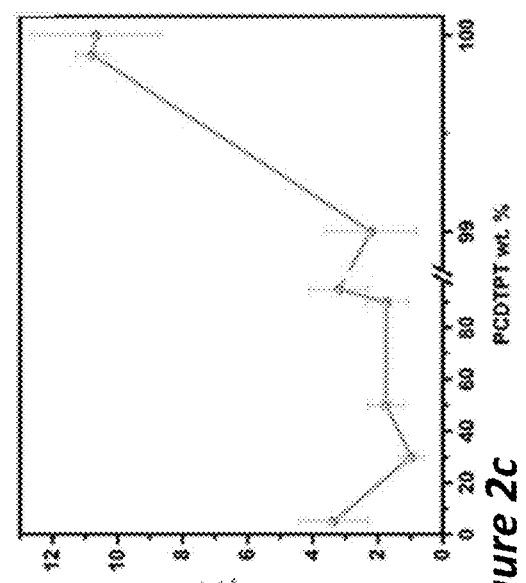
FIG. 2c shows threshold voltage ($V_T$) shift as a function of fullerene wt. % according to one or more embodiments of the present invention.
Figures 3A, 3B, 3C, 3D, 3E:
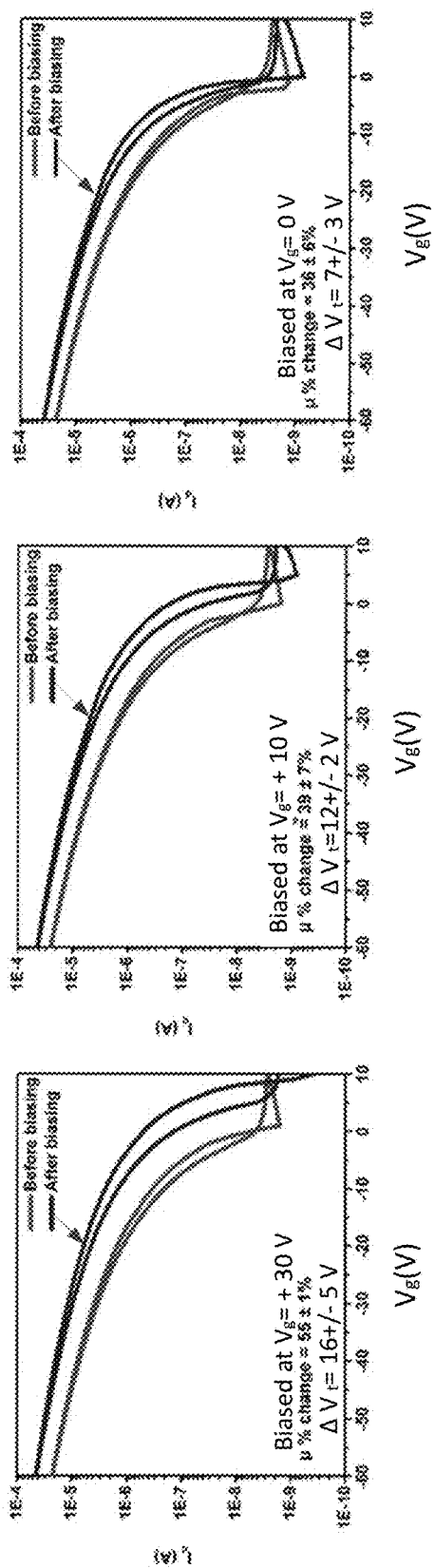
FIGS. 3a-3e show representative transfer curves for 95:5 wt. % PCDTPT:$PC_{61}$BM, according to one or more embodiments of the present invention, scanned forward and backwards before and after biasing devices at the corresponding $V_g$ and at $V_d$=−80 V, wherein device performance parameters were calculated by fitting the saturation regime equation in the $V_g$ range of −30 to −50 V, and the stability parameters μ % change and $\Delta V_T$, which are used as a relative metric, are calculated by comparing the performance parameters of at least eight devices before and after biasing.

Other device parameters, i.e., $V_T$ and $I_{ON}/I_{OFF}$, are also stabilized by the addition of $PC_{61}BM$. FIG. 2c plots the $V_T$ shift (the absolute value of the shift in $V_T$ from the 1$^{st}$ scan and the 20$^{th}$ scan) as a function of concentration. A small shift is desirable. Below 99:1 wt. % PCDTPT:$PC_{61}BM$, the $V_T$ shift does not exceed 3.4 V, whereas the pristine PCDTPT device displays $V_T$ shifts of 10 V after 20 scans.

In addition to these measurements, electrical instability was investigated by a stress-time test where $V_g$ and $V_d$ were held constant at 10 V and $-80$ V and $\Delta V_T$ was monitored over time. Similar experiments have been performed to extract a quantitative measurement of stability, namely a characteristic time constant extracted when fitting to a stretched exponential function.[21] These measurements reveal a characteristic time constant that is improved by nearly an order of magnitude for 95:5% PCDTPT:$PC_{61}BM$ relative to pristine PCDTPT, consistent with the bias-sweeping stability test (Figure S10 in the Supplementary Information[23]). FIG. 2d plots the range of $I_{ON}/I_{OFF}$ measured for each device over all 20 scans and shows $I_{ON}/I_{OFF}$ is improved after blending with $PC_{61}BM$ (the range and values of $I_{ON}/I_{OFF}$ is considerably narrower and has higher values upon blending with $PC_{61}BM$). A narrow range and high $I_{ON}/I_{OFF}$ would be ideal for real devices. For devices having between 30:70 wt. % PCDTPT:PC$_{61}$BM and 95:5 wt. % PCDTPT:PC$_{61}$BM, I$_{ON}$/I$_{OFF}$ between $10^4$-$10^5$ is observed. For comparison, the pristine PCDTPT devices exhibit I$_{ON}$/I$_{OFF}$ on the order of $10^1$-$10^4$.

Device stability was also tested when scanning to high positive V$_g$ and after cycling for ~15 minutes (Supplementary Figures 10-13[23]). The addition of PC$_{61}$BM was again observed to improve p-type OFET characteristics and device stability. Based on the assumption that electron injection is the underlying cause of instability, the inventors hypothesized that an applied positive V$_g$ would cause a current-voltage drift, whereas an applied negative V$_g$ would not. FIGS. 3a-3e show the results for a constant V$_g$ (30 V, 10 V, 0 V, −10 V, or −30 V) and V$_d$ (−80 V) applied for 5 minutes to devices containing 95:5 wt. % PCDTPT:PC$_{61}$BM. The results provide a baseline for additional stability measurements discussed later. There is a general a trend correlating increasing electron injection (i.e., higher positive V$_g$) with device instability. In V$_g$ regions where the majority of injected charge carriers are holes (V$_g$=−10, −30 V), devices exhibit suppressed changes in μ and V$_T$ to the extent that almost no change occurs.

c. PCDTFBT: C$_{60}$

Figure 4:
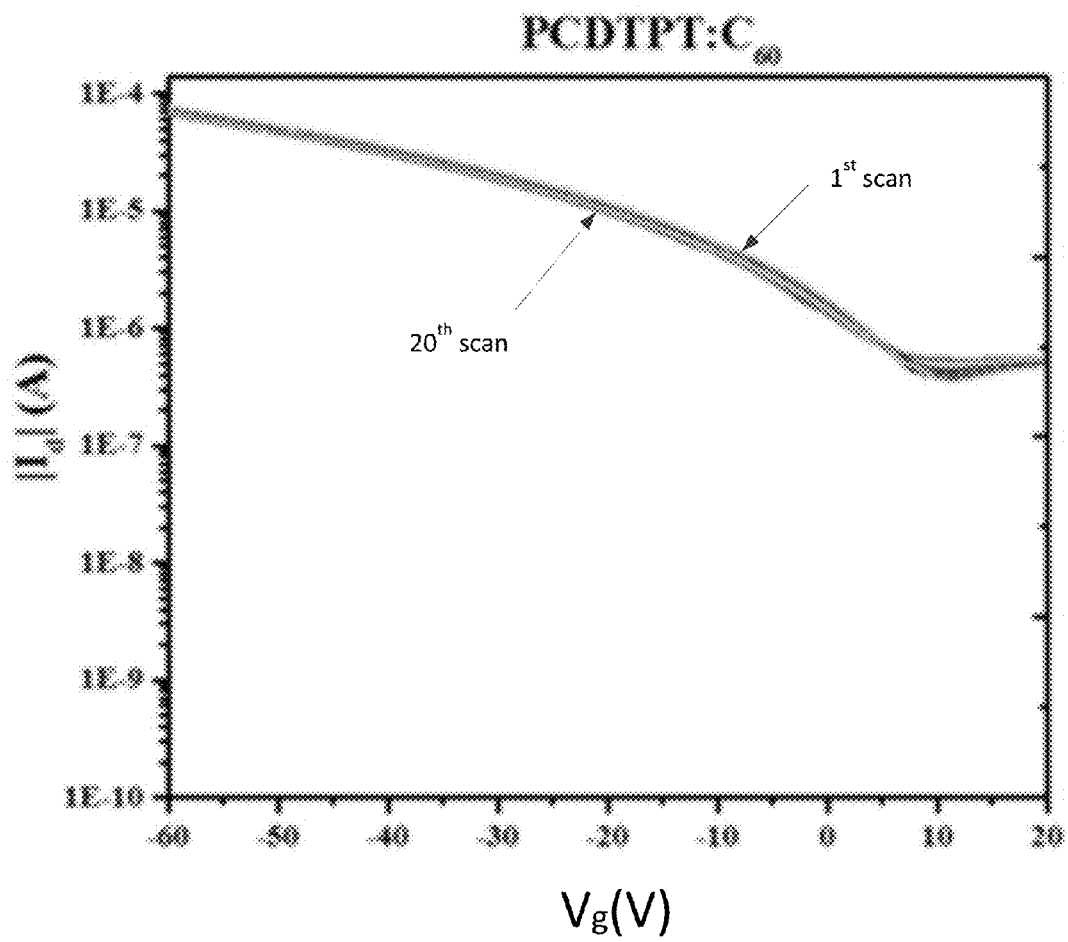
FIG. 4 plots 20 scans of $I_d$ vs $V_g$ for a PCDTPT: $C_{60}$ OFET according to one or more embodiments of the present invention.

FIG. 4 plots 20 scans of I$_d$ vs V$_g$ for a PCDTPT:C$_{60}$ OFET (fullerene C$_{60}$ is used in place of the PC$_{61}$BM). Again, the data shows double-slope is suppressed, a percent change in μ of 12% after 20 scans, a drift/shift in V$_T$ by 0.8 V between the 1$^{st}$ and 20th scan, and I$_{ON}$/I$_{OFF}$ ranging from 138 to 165 over the 20 scans. It is significant that the method of blending an additive to the semiconducting polymer has been shown to apply to other additive materials.

d. Choice of Dielectric

SiO$_2$ dielectrics are known to cause trapping effects[7]. Despite their relevance for scientific studies, solution processing, as well as their compatibility with standard photolithographic patterning techniques and dielectric modification (e.g., for polymer alignment), other dielectrics are under consideration for large area and flexible devices. Therefore, bottom-gate/top-contact OFETs on a divinyl-tetramethyl-siloxane-bis(benzocylcobutene) (BCB) polymer dielectric were also tested. BCB has been used to limit double-slope characteristics.[20] The inventors hypothesized that use of the BCB dielectric would shift ambipolar to unipolar p-transport in the OFET (if the shift reflects a property of the semiconductor blend layer). Indeed, results show unipolar p-type characteristics for an OFET comprising BCB with as little as 5 wt. % PC$_{61}$BM as an additive, as shown in Figure S8 of the Supporting information[23].

e. Use of Nanogrooves

Semiconductor layers were also cast on substrates containing ~100 nm wide and ~1-5 nm deep uniaxially oriented "nanogroove" channels, which can be used to align polymer fibers.[21-24] Fullerene addition in the semiconductor atop this dielectric layer also leads to improved stability (Figure S16). Higher mobilities were obtained relative to planar dielectric substrates (FIG. 2a). For example, an OFET comprising the 50:50 wt. % PCDTPT:PC$_{61}$BM blend with nanogrooves has μ=2.7±0.2 cm$^2$ V$^{-1}$ s$^{-1}$ (as compared to μ=0.43±0.02 cm$^2$ V$^{-1}$ s$^{-1}$ for the planar dielectric surface).

Thus, the impact of the fullerene additive is thus applicable under circumstances where alignment of conjugated polymer networks (e.g., by the nanogrooved substrate) is used to improve carrier mobilities/charge transport properties.

2. Second Example: DT-PDPPTT-DT

The general utility of fullerene addition was explored by applying the technique to another semiconducting polymer (DT-PDPPTT-DT) that displays ambipolar characteristics. DT-PDPPTT-DT (having the structure illustrated in FIG. 1a) was previously reported by the Janssen group[21] and exhibited hole and electron mobilities of 0.8 cm$^2$ V$^{-1}$ s$^{-1}$ and 1.5 cm$^2$ V$^{-1}$ s$^{-1}$ respectively.

Figures 5A, 5B:
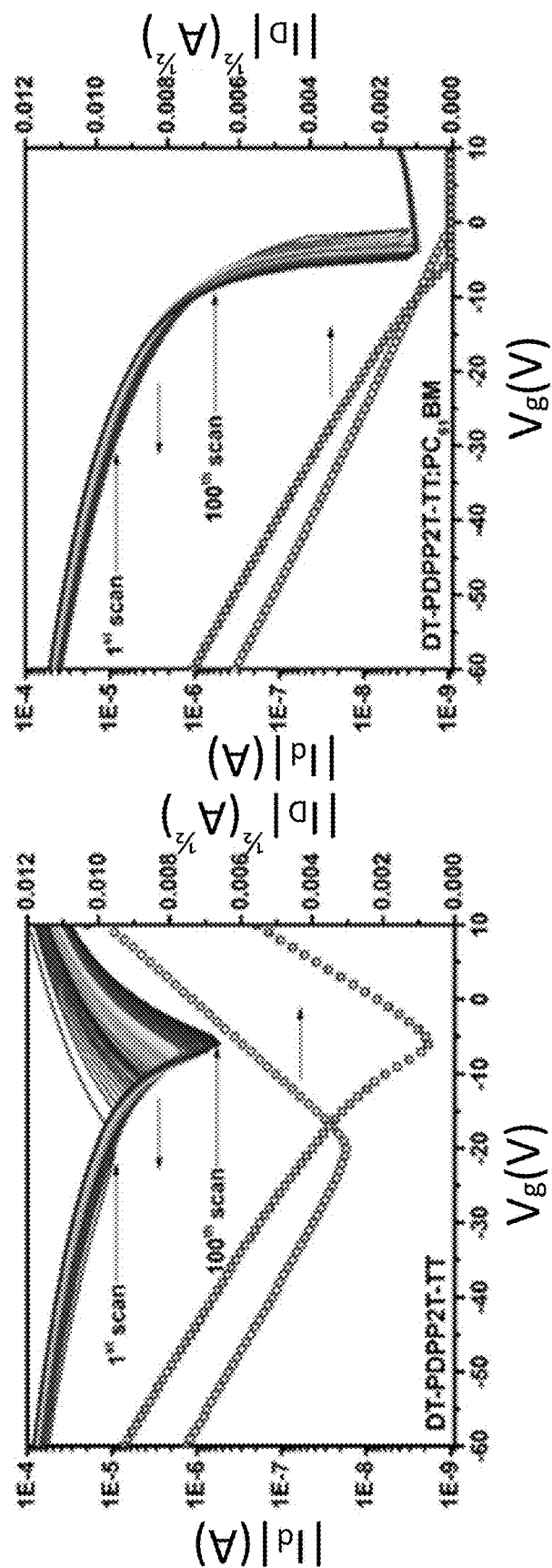
FIG. 5a shows 100 scan transfer characteristics for a pristine DT-PDPPTT-DT OFET. The 1st scan (purple) and the 100th scan (dark red) are indicated with arrows.
FIG. 5b shows 100 scan transfer characteristics for a 50:50 wt. % DT-PDPPTT-DT:$PC_{61}BM$ blend, according to one or more embodiments of the present invention, wherein the 1st scan and 100th scan are highlighted and the data demonstrate reduced bias stress effects with respect to μ % change, $\Delta V_T$, and $I_{ON}/I_{OFF}$ range.

FIGS. 5a-5b show that similar transfer characteristics to those reported in the literature (hole μ from 8 devices of 0.51±0.04 cm$^2$ V$^{-1}$ s$^{-1}$) could be obtained.

a. Pristine DT-PDPPTT-DT

FIG. 5a shows 100 scan transfer characteristics for a pristine DT-PDPPTT-DT OFET and shows testing of the stability of one DT-PDPPTT-DT device after 100-scans. The first scan of this device showed μ=0.45 cm$^2$ V$^{-1}$ s$^{-1}$, V$_T$=3.2, and I$_{ON}$/I$_{OFF}$=11.5. After 100 scans, qualitatively, it is apparent that the extent to which the instability and non-ideality manifest themselves is similar to PCDTPT. There is suppression of current due to electron injection in the V$_g$ regime of about 10 V to −10 V and increased hole current at V$_g$=−60 V after multiple scans, resulting in I$_{ON}$/I$_{OFF}$ on the order of $10^2$. V$_T$ shifts from 3.2 to 12.7 V. The double-slope behavior is apparent in DT-PDPPTT-DT after 100 scans with a higher μ=3.3 cm$^2$ V$^{-1}$ s$^{-1}$ obtained in the lower absolute V$_g$ regime.

b. DT-PDPPTT-DT: PC$_{61}$BM

Devices from a 50 wt. % DT-PDPPTT-DT:PC$_{61}$BM blend solution (average hole μ=0.39±0.03 cm$^2$ V$^{-1}$ s$^{-1}$ for 8 devices) were prepared. FIG. 5b shows the results of testing the 100-scan stability of the devices fabricated using the 50 wt. % DT-PDPPTT-DT:PC$_{61}$BM blend solution. Relative to the performance of the OFET comprising pristine DT-PDPPTT-DT shown in FIG. 5a, the data for the device containing DT-PDPPTT-DT:PC$_{61}$BM reveal addition of the PC$_{61}$BM improved I$_{ON}$/I$_{OFF}$ ratio (wherein the I$_{ON}$/I$_{OFF}$ ranged from 15100 to 23200 over 100 scans), shifted V$_T$ from −2.82 to 1.08, suppressed the double-slope characteristics, and suppressed the electron current. If taken from the double-slope after 100 scans, μ is as high as 3.5 cm$^2$ V$^{-1}$ s$^{-1}$ for the pristine DT-PDPP2T-TT device; but μ is reduced to 1.1 cm$^2$ V$^{-1}$ s$^{-1}$ in the blend device.

To provide more evidence of the improved p-type behavior and non-ideality suppression upon addition of PC$_{61}$BM, the average μ percent change, V$_T$ shift, and I$_{ON}$/I$_{OFF}$ range of 8 DT-PDPPTT-DT and DT-PDPPTT-DT:PC$_{61}$BM devices was measured (results shown in the Supporting Information[23]). It is clear that the V$_T$ shift, I$_{ON}$/I$_{OFF}$ range, and μ percent change in the lower absolute V$_g$ regime can be controlled after blending the polymer semiconductor with PC$_{61}$BM. Differences in the extent to which these instabilities and non-idealities are controlled by PC$_{61}$BM (as compared to PCDTPT) suggests that factors such as the electron μ of the ambipolar semiconductor, the electronic structure of the ambipolar semiconductor, and the morphology within the blend film may play a significant role in PC$_{61}$BM modulating p-type OFET behavior.

3. Third Example: PCDTFBT

In addition to DT-PDPPTT-DT and PCDTPT, another polymer, PCDTFBT was also blended with PC$_{61}$BM.

a. Pristine PCDTFBT

Figure 6A:
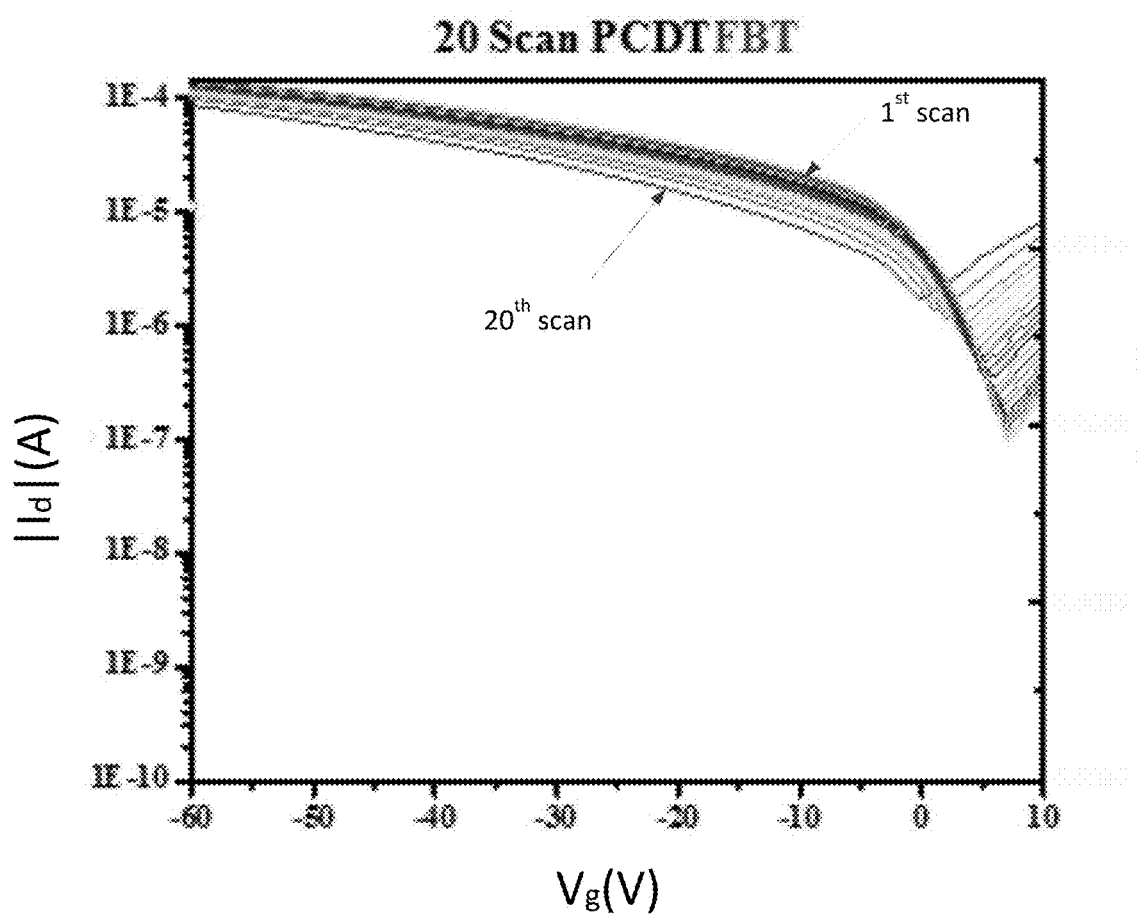
FIG. 6a plots 20 scans of $I_d$ versus (vs) $V_g$ for a pristine PCDTFBT OFET.

FIG. 6a shows the pristine polymer's stability over 20 scans. The initial μ is 0.87 cm$^2$ V$^{-1}$ s$^{-1}$, V$_T$ is 7.9 V, and I$_{ON}$/I$_{OFF}$ is 24.6. After 20 scans, the double-slope is observed, and the percent change in μ can be as high as 684%. V$_T$ drifts to 28.6 V and I$_{ON}$/I$_{OFF}$ increases to 807.

b. PCDTFBT: PC$_{61}$BM

Figure 6B:
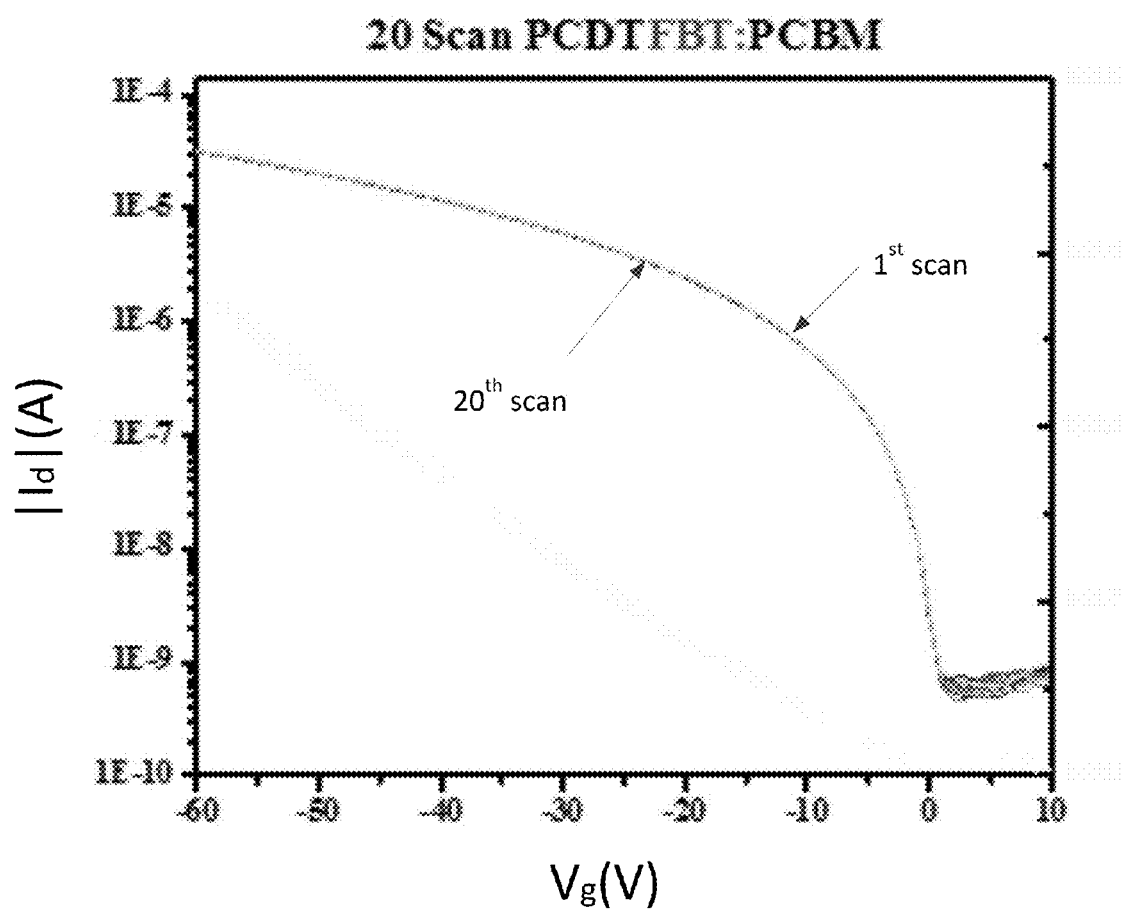
FIG. 6b plots 20 scans of $I_d$ vs $V_g$ for a PCDTFBT:PCBM OFET according to one or more embodiments of the present invention.

FIG. 6b plots 20 scans of I$_d$ vs V$_g$ for a PCDTFBT:PCBM OFET fabricated using a 50 wt. % PCDTFBT with PC$_{61}$BM. When blending 50 wt. % PCDTFBT with PC$_{61}$BM in the OFET, the percent change in μ after 20 scans decreases to 4%, the $V_T$ drift/shift between the first and $20^{th}$ scan is 0.05 V, the $I_{ON}/I_{OFF}$ ranges from 5.11E4 to 6.69E4, and the double-slope is suppressed.

4. Fourth Example: PCDTBT:PCBM Blends

FIGS. 7a-7d compare the OFET stability under bias stress for a PCDTBT:PC$_{61}$BM blend (FIGS. 7a and 7c) relative to a PCDTPT:PC$_{61}$BM blend (FIGS. 7b, 7d), illustrating that increased OFET stability is also achieved by adding a fullerene to a PCDTBT based OFET.

PCDTBT:PC$_{61}$BM devices were also cast on nano-grooved substrates to align the polymer and improve p. Aligned PCDTBT:PC$_{61}$BM devices obtained μ as high as 5.6 cm$^2$ V$^{-1}$ s$^{-1}$ (See Figure S21 of the Supporting Information[23]). This compares favorably to an OFET comprising the 50:50 wt. % PCDTPT:PC$_{61}$BM blend with nano-grooves having μ=2.7±0.2 cm$^2$ V$^{-1}$ s$^{-1}$.

5. Comparative Examples a. Choice of Fullerene

Figure 8:
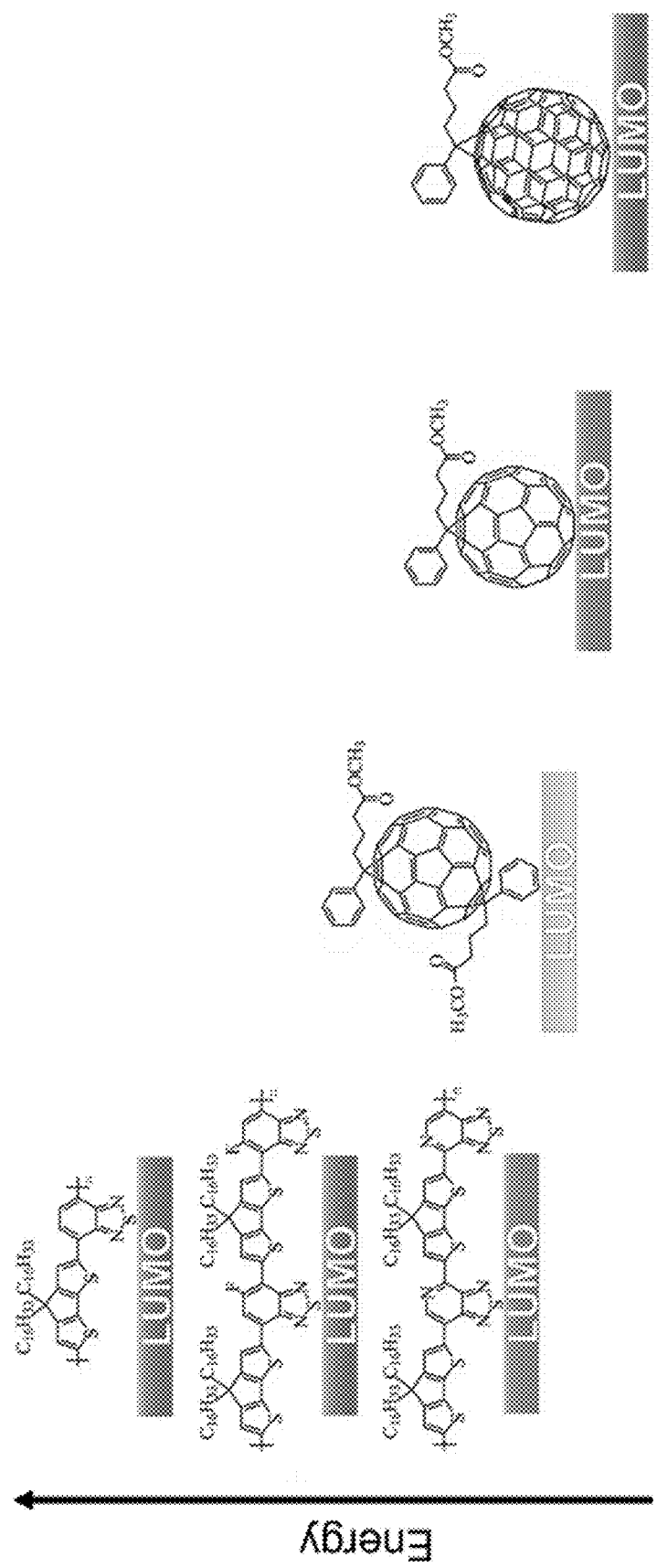
FIG. 8 shows the chemical structures of the organic semiconductors and fullerenes that are blended according to one or more embodiments of the present invention, showing relative LUMO offsets based on literature values (see text for values), wherein the different fullerene derivatives (from left to right) are bis-PCBM, $PC_{61}BM$, and $PC_{85}BM$, and the different polymer semiconductors (from top to bottom) are PCDTBT, PCDTFBT, and PCDTPT.

Under the assumption that a significant fraction of injected electrons are ultimately located in the fullerene, the inventors of the present invention hypothesize that the driving force for the process increasing stability, suppressing double slope, and suppressing electron transport of the OFETs should be tunable by the electron affinity of the fullerene. The lowest unoccupied molecular orbital (LUMO) energy level for PCDTPT determined by cyclic voltammetry is ~4.0 eV.[19] The precise value of the PC$_{61}$BM LUMO energy has been discussed in the literature, and is typically reported in the range of ~3.7-4.3 eV.[26] The effects of blending PCDTPT with different fullerene acceptors were examined, specifically, by blending PCDTPT with bis-PCBM, PC$_{61}$BM, and PC$_{85}$BM, which are listed in FIG. 8 in order of increasing LUMO offset. The LUMO of bis-PCBM has been measured as ~0.1 eV closer to vacuum relative to PC$_{61}$BM, while the LUMO of PC$_{85}$BM has been measured as ~0.3 eV further from vacuum relative to PC$_{61}$BM.[27,28]

Figure 9B:
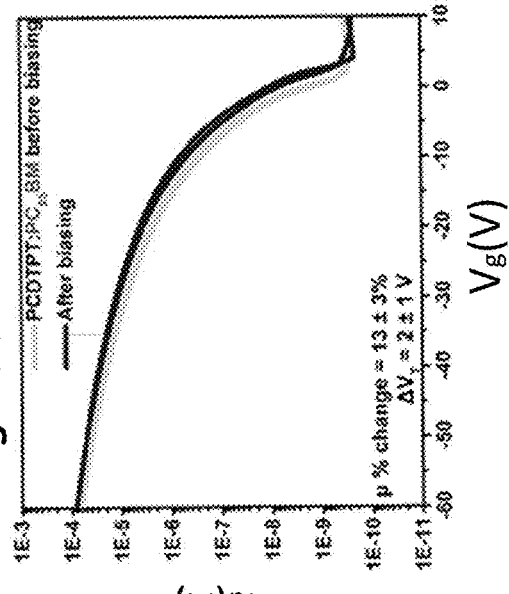
FIG. 9b plots representative transfer curves for one of the most stable blends (PCDTPT:$PC_{85}BM$) according to one or more embodiments of the present invention.
Figure 9D:
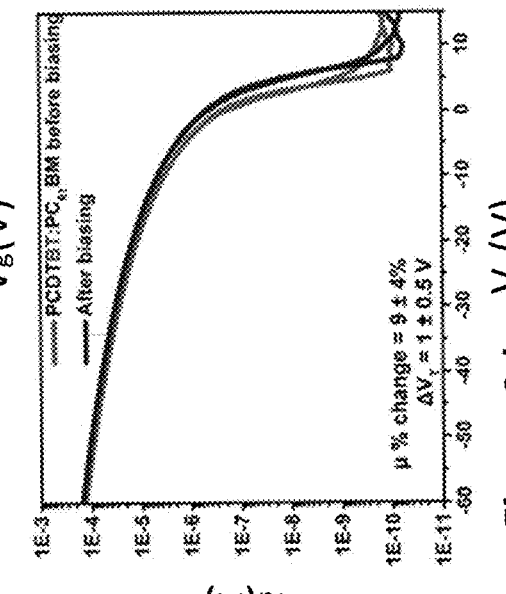
FIG. 9d plots representative transfer curves for another of the most stable blends (PCDTBT:$PC_{61}BM$), according to one or more embodiments of the present invention, wherein the results in FIGS. 7b and 7d were obtained for sweeping forward and backwards before and after biasing devices at $V_g$=10 V and at $V_d$=−80 V, device performance parameters in FIGS. 7a and 7c were calculated by fitting the saturation regime equation in the $V_g$ range of −30 to −50 V, and at least 8 devices were tested for each condition.
Figure 9A:
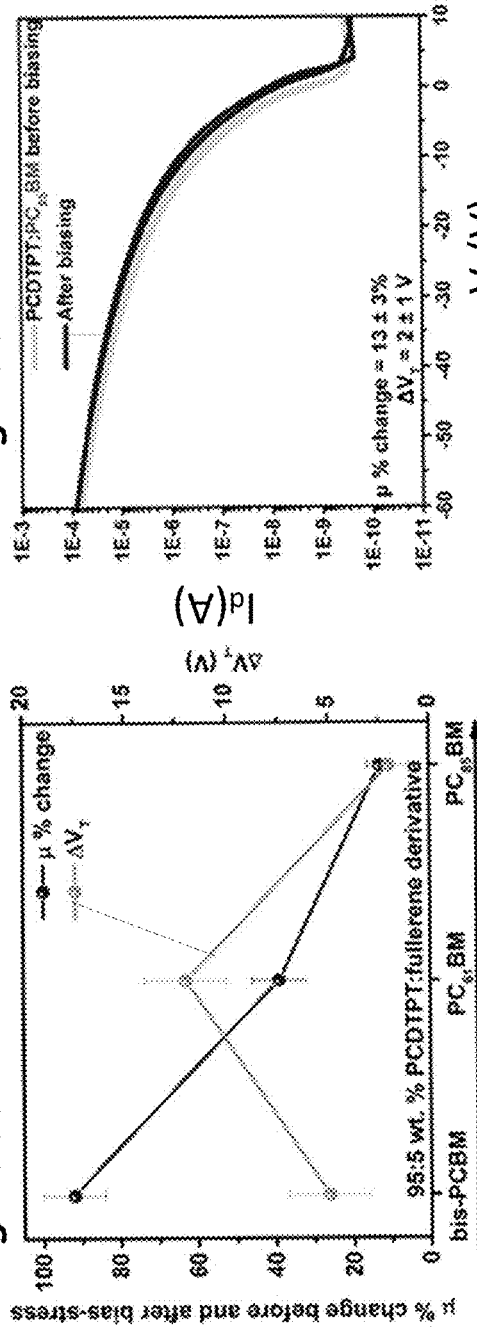
FIG. 9a plots the stability parameters μ % change and $\Delta V_T$, which are used as a relative metric, calculated by comparing the performance parameters before and after biasing the PCDTPT:fullerene blends, as a function of the composition of the fullerene derivative blended with the PCDTPT according to one or more embodiments of the present invention.

FIG. 9a provides the $\Delta V_T$, μ % change, and FIG. 9b displays transfer curves for the most stable blend in this series, namely PCDTPT:PC$_{85}$BM. Figure S17 in the supporting information[23] shows representative transfer curves for the remainder of the 95:5 wt. % PCDTPT:fullerene devices before and after scanning at $V_g$=10 V and $V_d$=−80 V for 5 minutes. Less substantial % μ changes are observed for PCDTPT:PC$_{85}$BM, which has the greatest LUMO offset and supports that OFET stability is improved with increasing electron affinity of the fullerene.

b. Choice of Semiconducting Polymer

The examples provided herein support that the LUMO offset between the conjugated polymer and the fullerene improve OFET stability for a variety of different additives and semiconducting polymers, including structurally-related polymers PCDTBT, PCDTFBT, and PCDTPT. The reported LUMO values for these polymers using cyclic voltammetry and their optical band gaps are ~3.6, 3.8, and 4.0 eV for PCDTBT, PCDTFBT, and PCDTPT, respectively.[15,25]

Figure 9C:
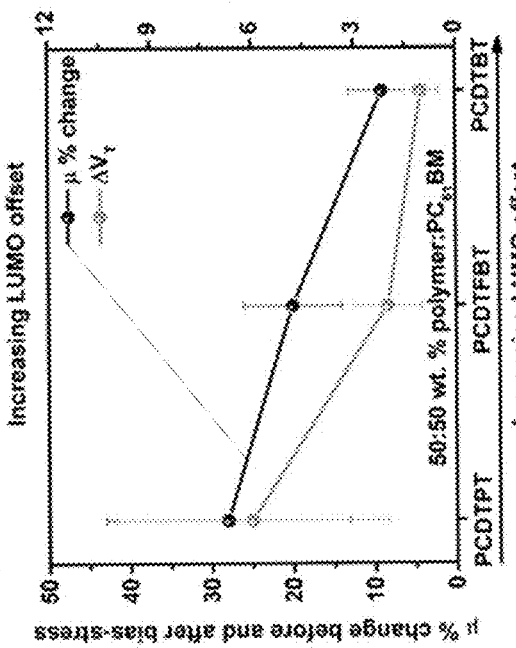
FIG. 9c plots the stability parameters μ % change and $\Delta V_T$ calculated by comparing the performance parameters before and after biasing the polymer:$PC_{61}BM$ blends, as a function of the composition of the semiconducting polymer blended with the $PC_{61}BM$, according to one or more embodiments of the present invention.

FIG. 9c provides the $\Delta V_T$, μ% change, and FIG. 9d displays transfer curves, for the most stable blend in this series (PCDTBT:PC$_{61}$BM). Figure S18 in the Supporting Information[23] shows transfer curves for the remainder 50:50 wt. % polymer semiconductor:PC$_{61}$BM devices before and after biasing. Pristine polymers exhibit μ that increase by up to 211±94% (PCDTPT), 85±58% (PCDTFBT), and 50±28% (PCDTBT) and $V_T$ of 11±4 V (PCDTPT), 6±3 V (PCDTFBT), and 2±1 V (PCDTBT) after stress biasing (table S5).

FIGS. 9a-9d show that the most stable devices (relative to change in μ and $V_T$) are obtained with PCDTBT:PC$_{61}$BM blends, which have the largest LUMO offset. The double-slope is suppressed in all polymer:PC$_{61}$BM blends. Similar bias stress tests on the pristine polymers were also performed at $V_g$=30 V (Figure S19 in the Supporting Information[23]). This further confirms the importance of relative LUMO offset between the polymer semiconductor and the fullerene phase.

c. Stability Under Bias Stress as a Function of Blend Composition

If a high enough $V_g$ is applied for a period of time to some fullerene blend devices, a drift in current-voltage characteristics can be observed. PCDTBT:PC$_{61}$BM devices were therefore subjected to a variety of conditions to test variations in performance, with results illustrated in FIGS. 7a-7d.

Biasing PCDTBT:PC$_{61}$BM for five minutes at $V_g$=30 V results in μ increasing by 28±3% and a $\Delta V_T$ of 4±2 V; these changes are similar to the PCDTPT:PC$_{61}$BM devices when applying a lower $V_g$=10 V (see Supporting Information[23]). Successively higher initial $V_g$ was applied to investigate the effects on the current-voltage characteristics (see FIG. 7a and FIG. 7b). This results in no change in μ, $\Delta V_T$=1 V and little change in $I_{ON}/I_{OFF}$ for the PCDTBT:PC$_{61}$BM device.

For comparison, PCDTPT:PC$_{61}$BM shows larger changes in current-voltage characteristics with μ increasing by ~50% and $\Delta V_T$=~6 V.

Figure 7A:
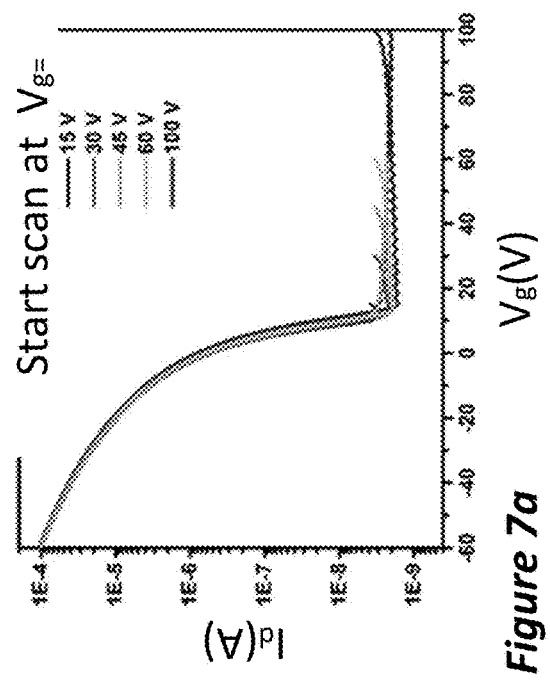
FIGS. 7a-7d compare the OFET stability under bias stress for a PCDTBT:$PC_{61}BM$ blend (FIGS. 7a and 7c) relative to a PCDTPT:$PC_{61}BM$ blend (FIGS. 7b and 7d), according to one or more embodiments of the present invention, wherein OFET stability was examined by starting the scan at subsequently higher $V_g$ (as shown in FIGS. 7a and 7b) and scanning for extended periods of time (as shown in FIGS. 7c and 7d).
Figure 7B:
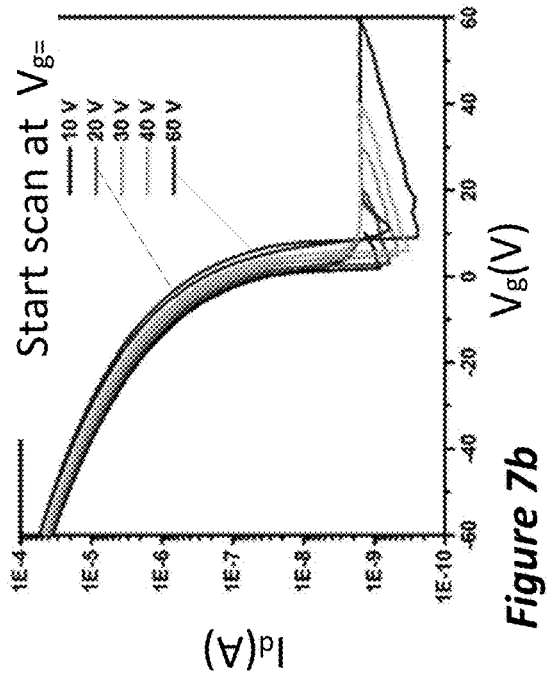
Figure 7C:
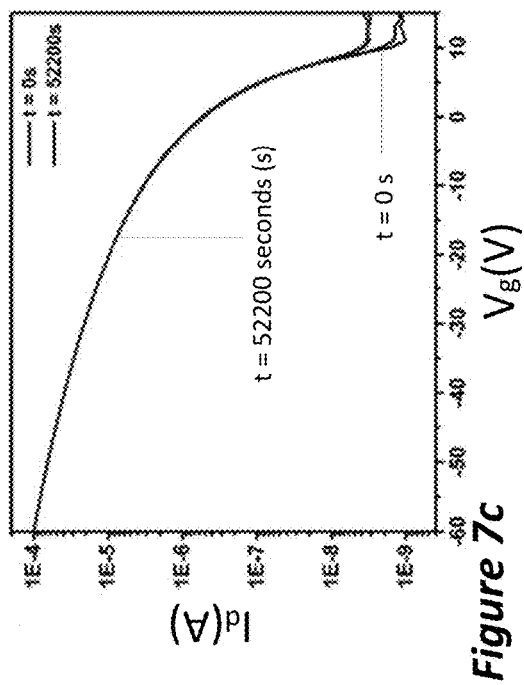

A PCDTBT:PC$_{61}$BM device was also subjected to bias-sweeping from $V_g$=15 to −60 V while holding $V_d$=−80 V for t=52200 seconds (s) (FIG. 7c). Again, μ is unchanged, $\Delta V_T$=−1 V, and $I_{ON}/I_{OFF}$ shows little change. The device was left off for another 10 hours (h) resulting in similarly little change in OFET performance (see Figure S20 in the Supporting Information[23]).

Figure 7D:
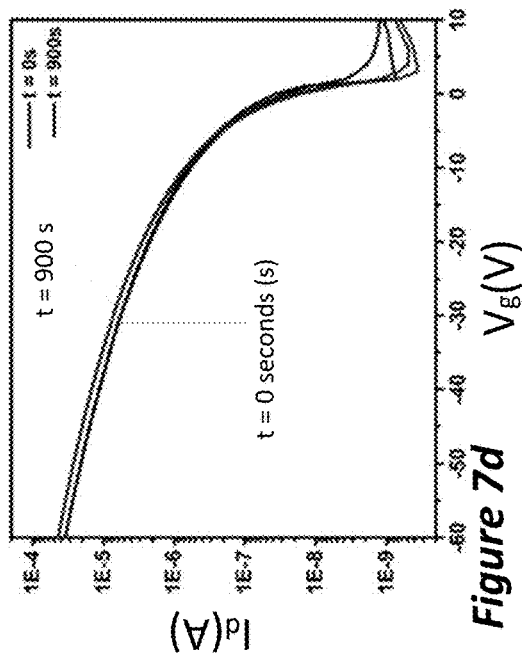

PCDTPT:PC$_{61}$BM devices, on the other hand, are not nearly as robust with changes in current-voltage characteristics occurring even after only 900 s of continuous scanning (FIG. 7d).

5. Device Fabrication Example

The OFETs comprising the PCDTPT, DT-PDPPTT-DT, PCDTFBT, PCDTBT and corresponding blends, as described in the first, second, third, fourth, and comparative examples (and characterized by the data in Figures 1-9) were fabricated according to the following method unless indicated otherwise.

A 300 nm SiO$_2$ dielectric/doped Si (University Wafer) substrate was cleaned with piranha. Where specified, diamond lapping films (from Allied High Tech Products, Inc.) with diamond particle size of 100 nm were used to introduce "nanogrooves" on the surface of the SiO$_2$ gate dielectric layer. Source and drain contacts (5 nm Ni/50 nm Au) were deposited using two-step photolithography. Before polymer deposition, the substrates were cleaned by sonication in acetone and isopropanol for 3 minutes each, and were then dried in an oven under air, at 120° C. for 10 minutes. The substrates were treated with UV-03 for 15 minutes and underwent acid hydrolysis to etch the Ni adhesion layer. Subsequently, the substrates were oven dried, treated again with UV-03, and then passivated by using decyltrichlorosilane (from Gelest Chemicals) from a 0.2 vol % toluene solution at 80° C. for 25 minutes. The substrates were rinsed and sonicated in toluene and dried under air flow. Blend films were deposited by blade-coating immediately after. The blend concentration in solution (chlorobenzene) was 5 mg/mL with respect to the total fullerene+polymer semiconductor content. PCDTPT, PCDTBT, PCDTFBT, which were synthesized according to previous procedures[15,25]

and various fullerenes were dissolved in chlorobenzene and mixed by volume to obtain the corresponding blend weight ratio.

A blade-coat and stage was built using a LTA-HS actuator and integrated CONEX-CC controller. The blades used were glass microscope slides, which were cleaned by piranha solution. The substrate was coated by injecting 8 µL of solution in between a ~100 µm channel formed between the blade and the substrate. The blade angle was set to 60° relative to the plane of the substrate. Blade-coating conditions were 100° C. and 1.2 mm/s. Bottom gate, bottom contact field-effect transistors were fabricated for all blend compositions. Devices were annealed for 200° C. for 8 minutes and tested immediately after annealing. The final device architecture (from bottom to top) for these bottom gate, bottom contact field-effect transistors was Si (500 µm)/DTS-treated SiO$_2$ (300 nm)/Ni (5 nm)/Au (50 nm)/blend layer.

The mobility of blend devices were obtained by fitting the following equation to the saturation regime transfer characteristics: $I_{DS}=(W/2L)C_i\mu(V_{GS}-V_{th})^2$, where W is the channel width (1 mm), L is the channel length (80 or 160 µm), $C_i$ is the gate dielectric layer capacitance per unit area (10 and 11.5 nF/cm$^2$ for normal and nanogrooved substrates[1]), $V_{GS}$ is the gate voltage, $V_{th}$ is the threshold voltage, and $I_{DS}$ is the source-drain voltage. Devices were measured under nitrogen in a glovebox using a Signatone 1160 probe station and Keithley 4200 semiconductor parametric analyser. Mobility values are calculated from a gate voltage range of −30 V to −50 V at a source-drain voltage of −80 V.

Process Steps

Figure 10:
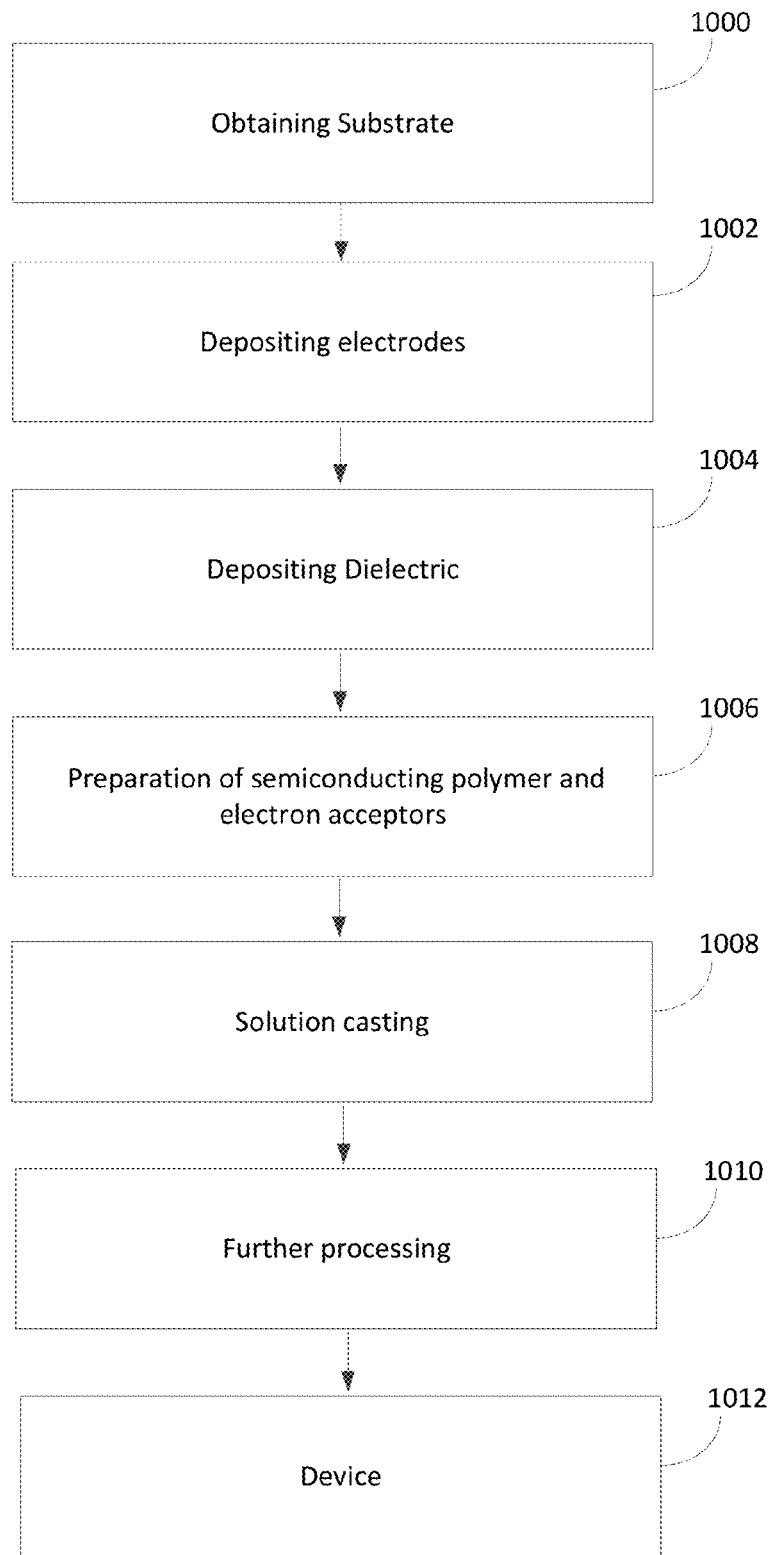
FIG. 10 is a flowchart illustrating a method of fabricating a device according to one or more embodiments of the invention.
Figure 11A:
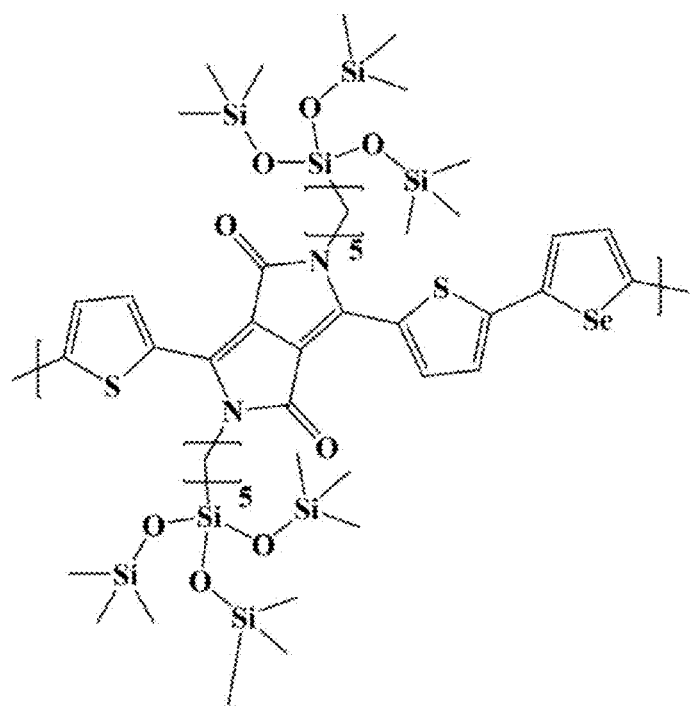
Figure 11A:
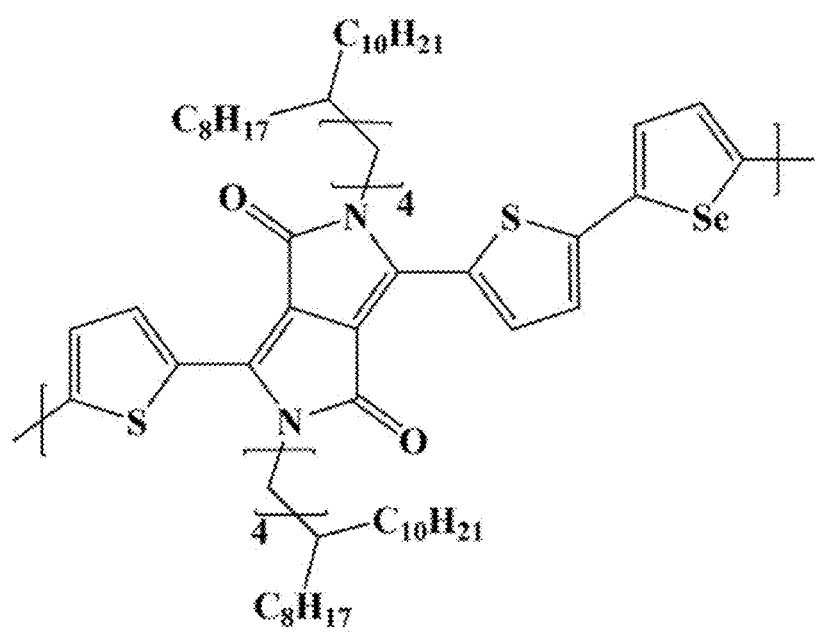
Figure 11B:
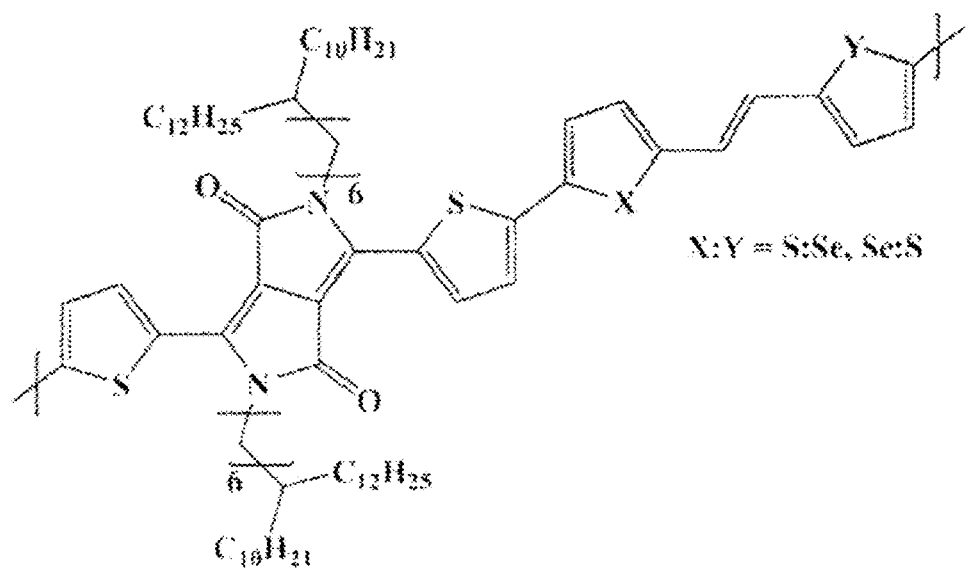
Figure 11B:
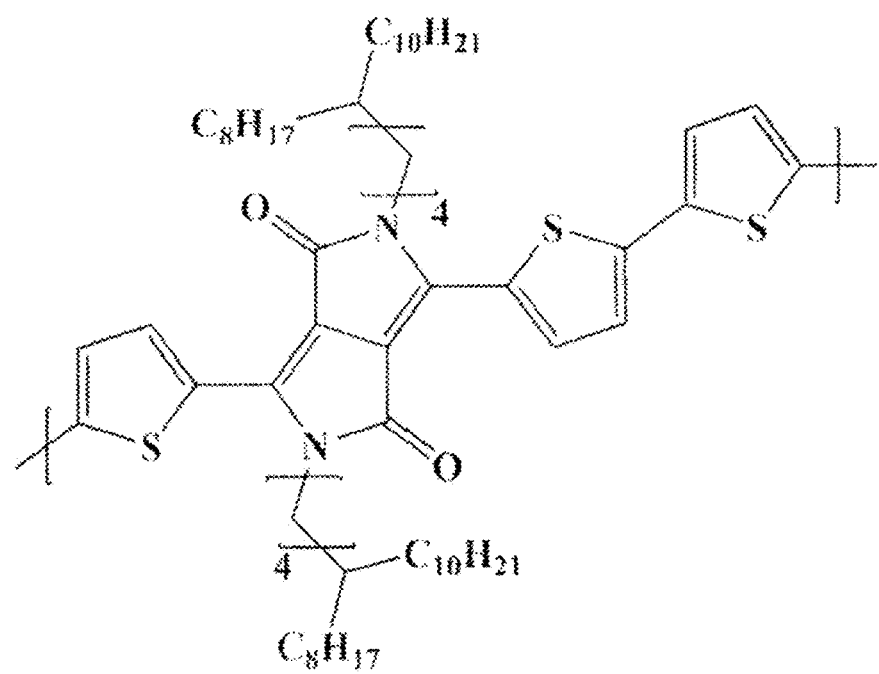
Figure 11C:
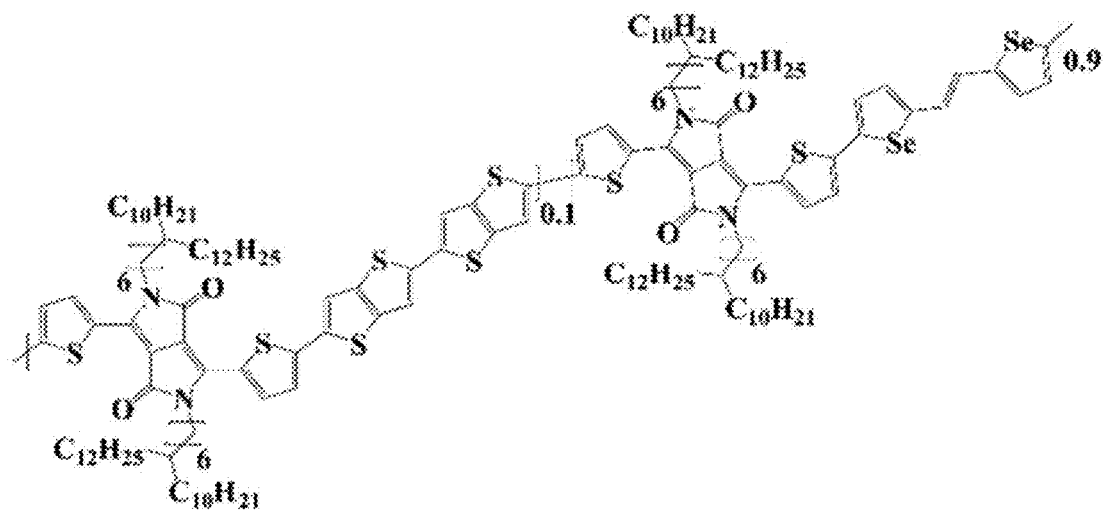
Figure 11C:
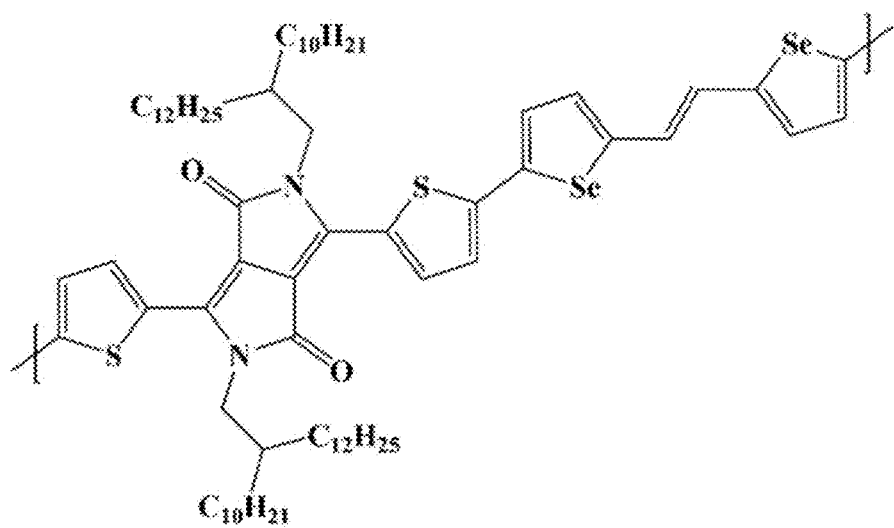
Figure 11D:
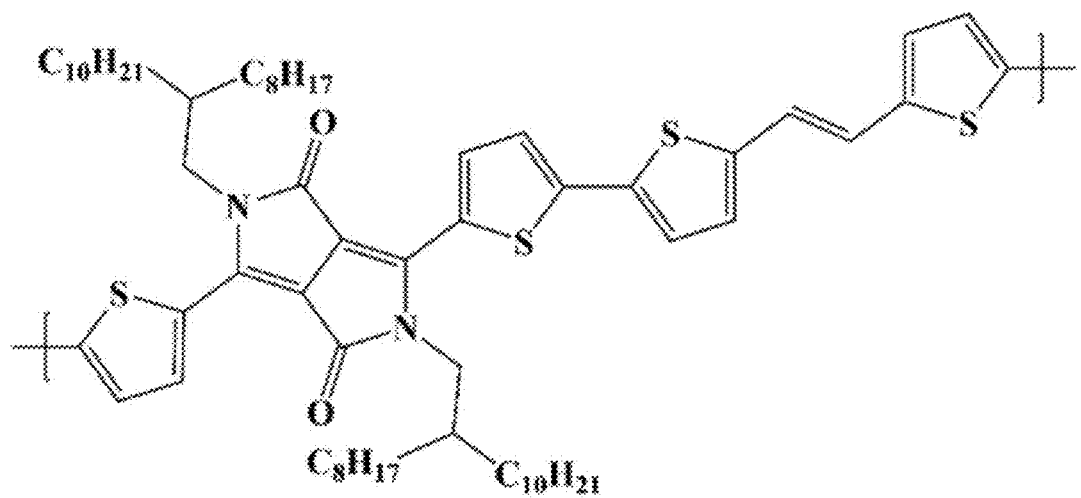
Figure 11D:
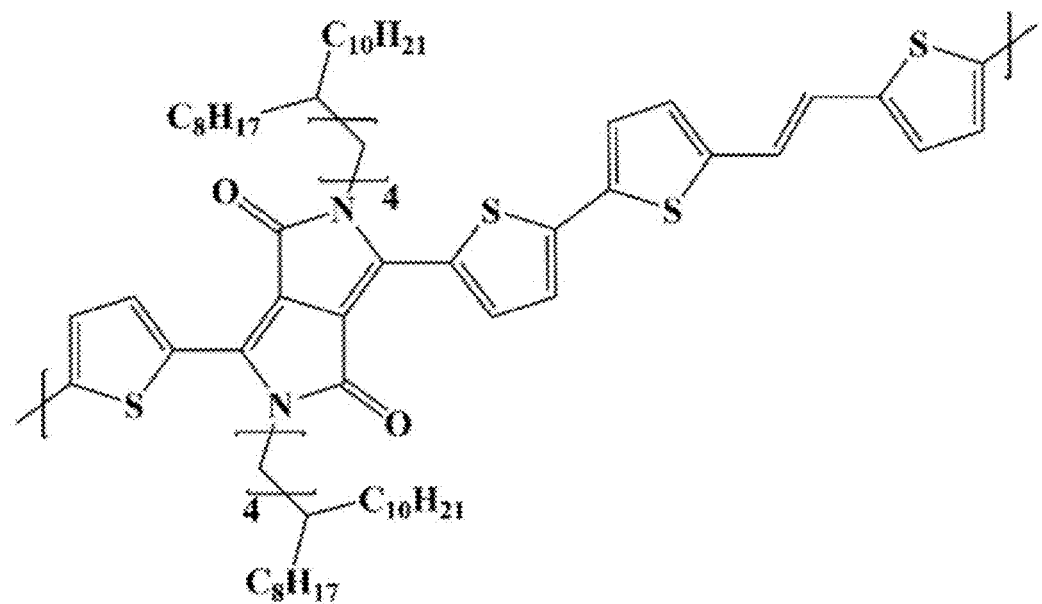
Figure 11E:
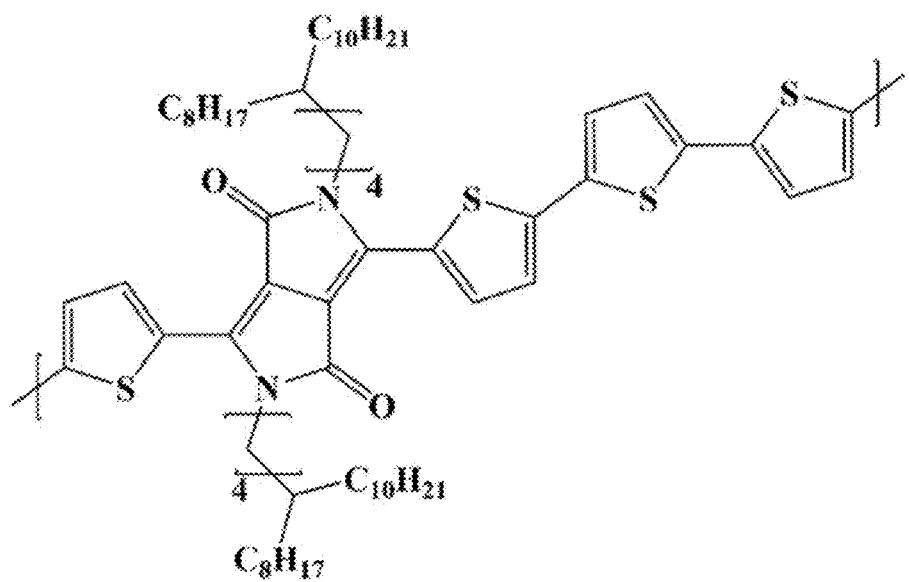
Figure 11E:
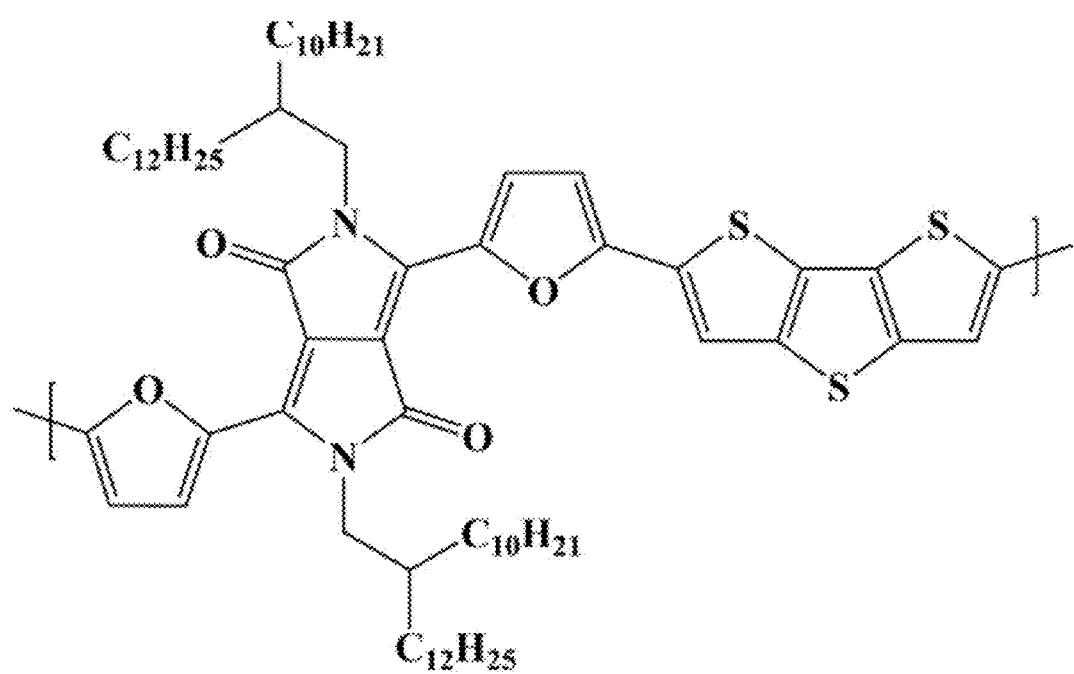
Figure 11F:
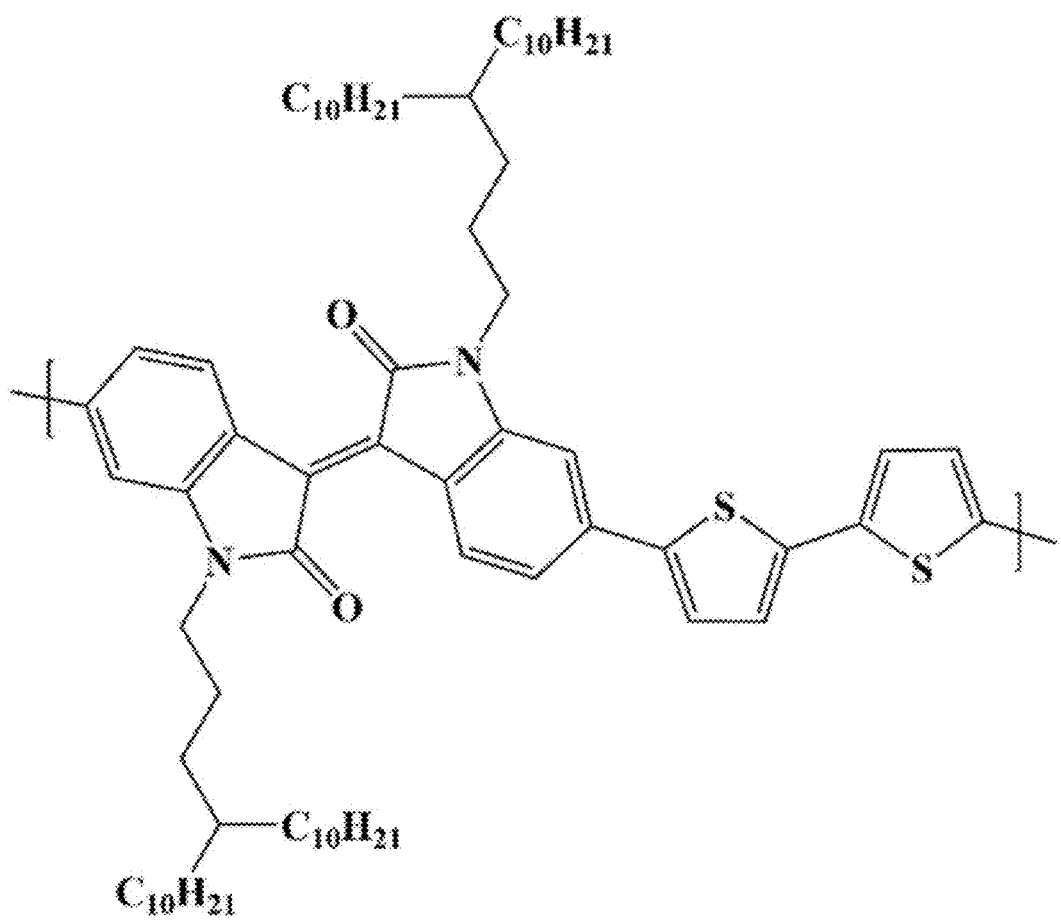
Figure 11F:
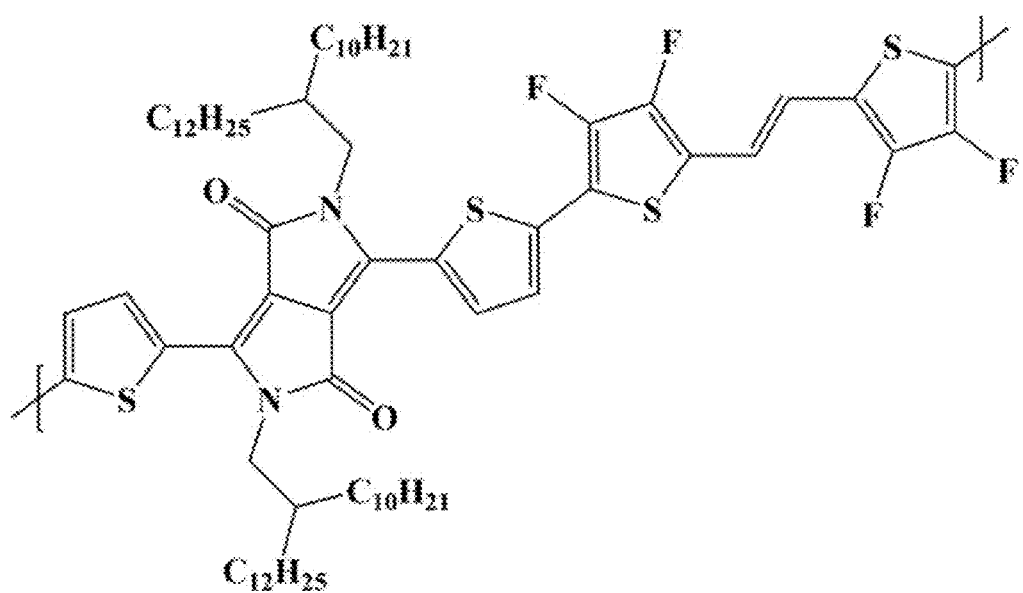
Figure 11G:
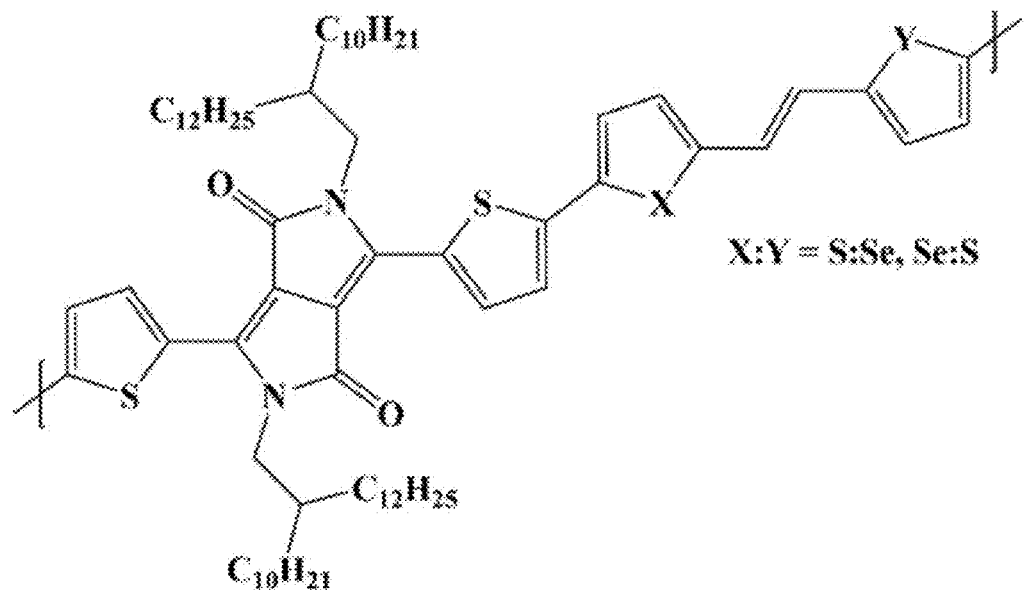
Figure 11G:
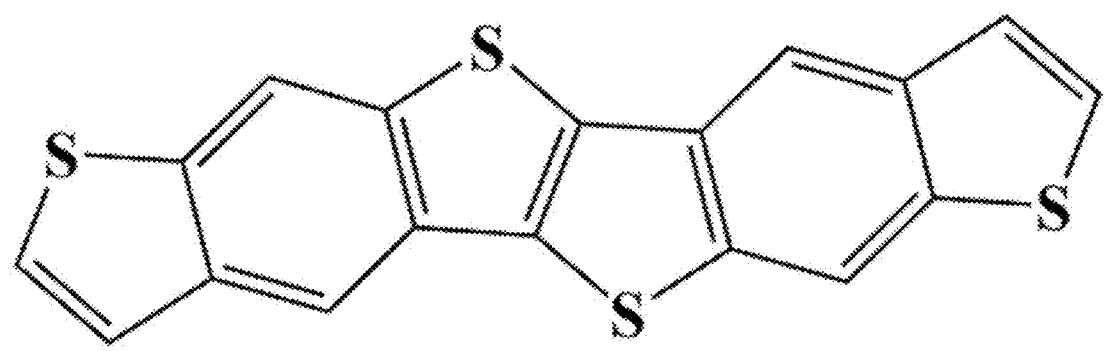
Figure 11H:
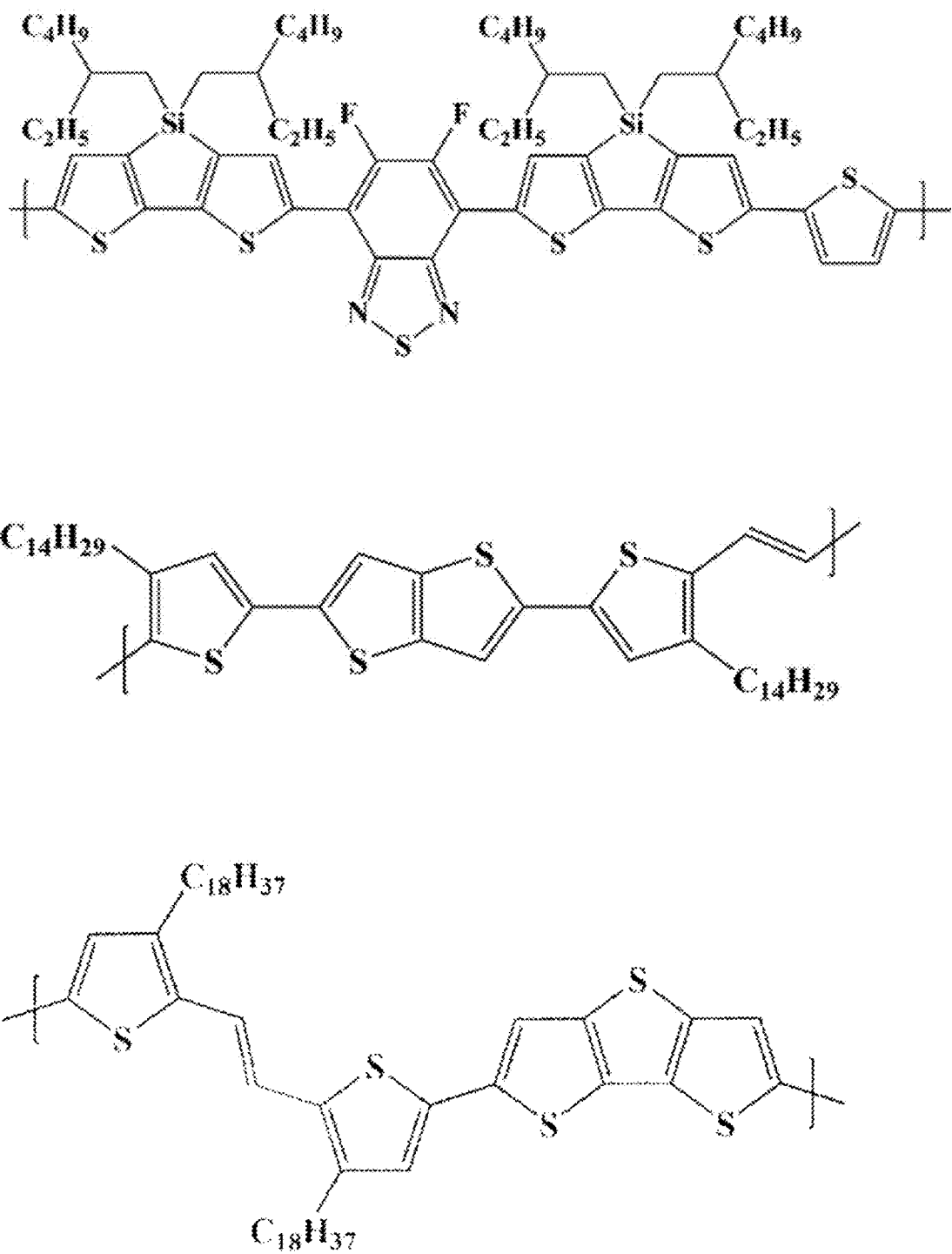
Figure 11I:
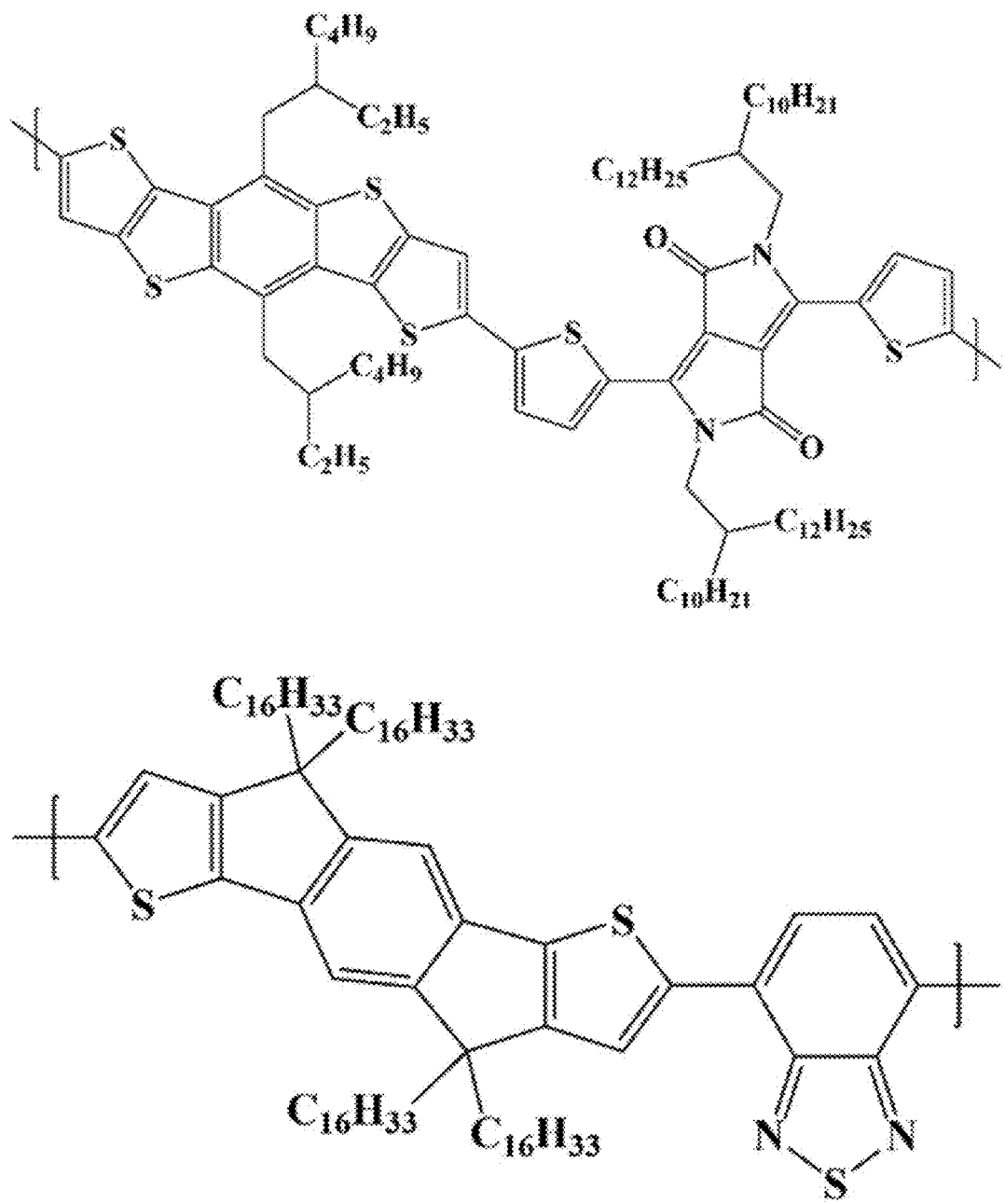
Figure 11J:
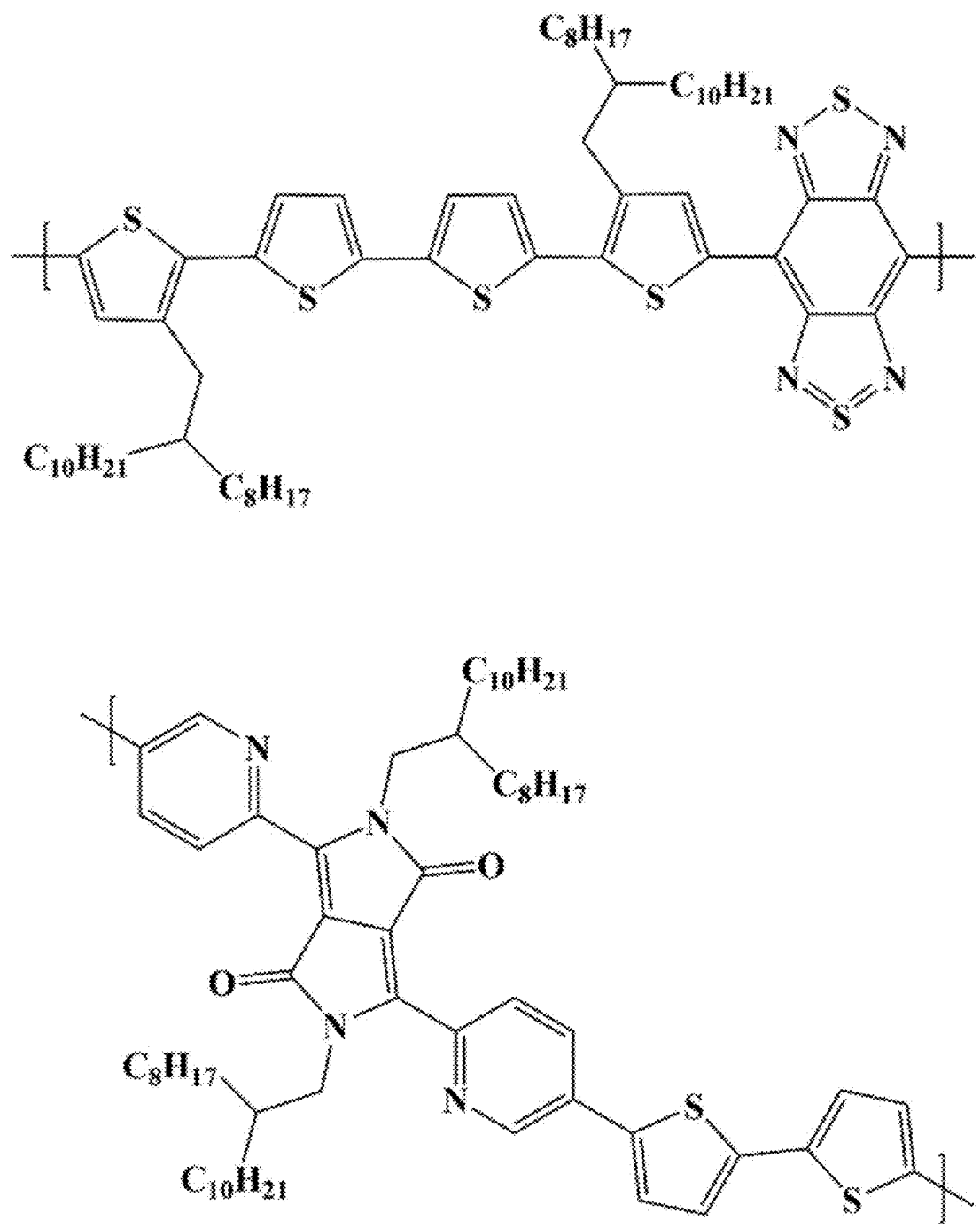
Figure 11K:
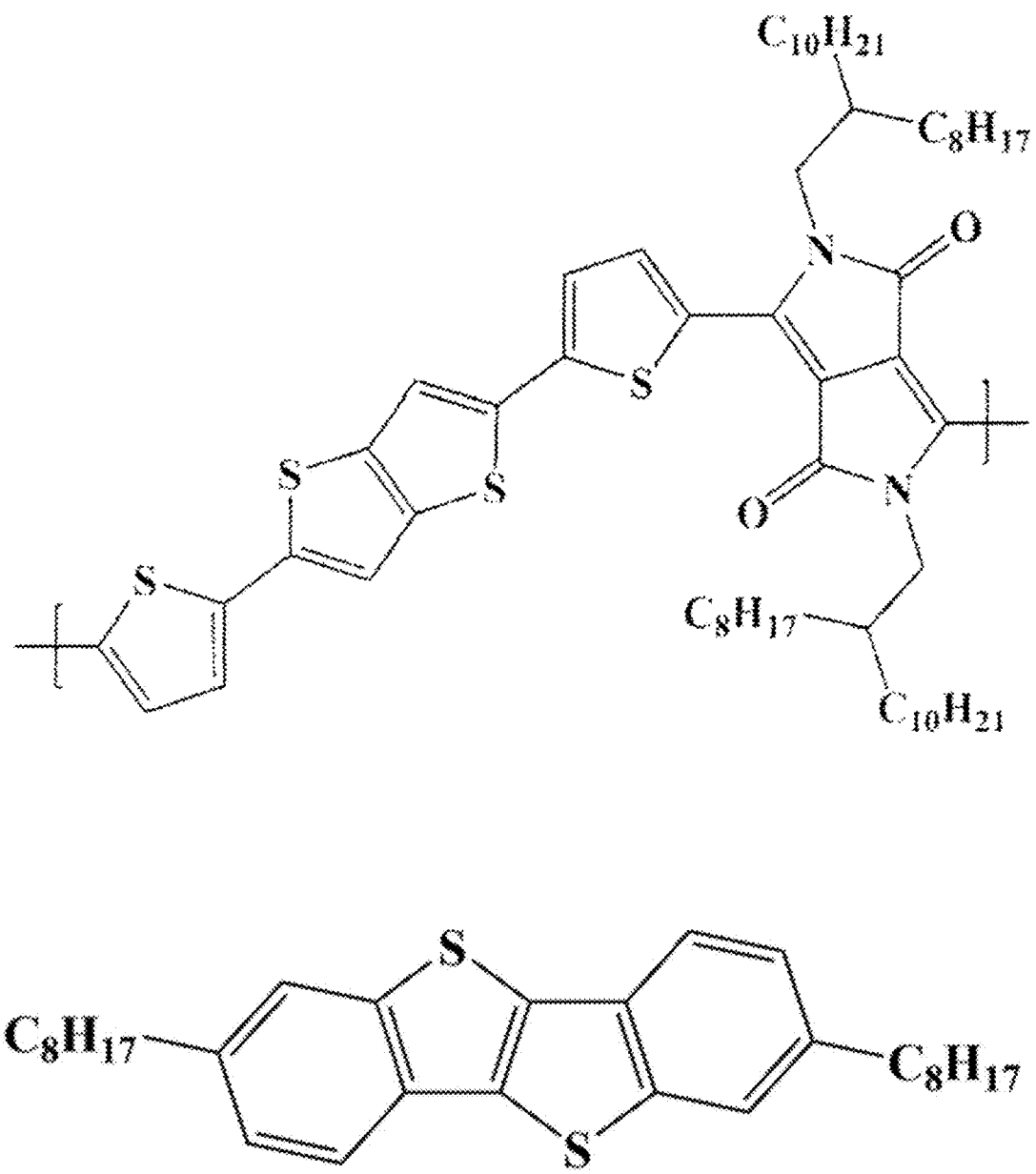
Figure 11I:
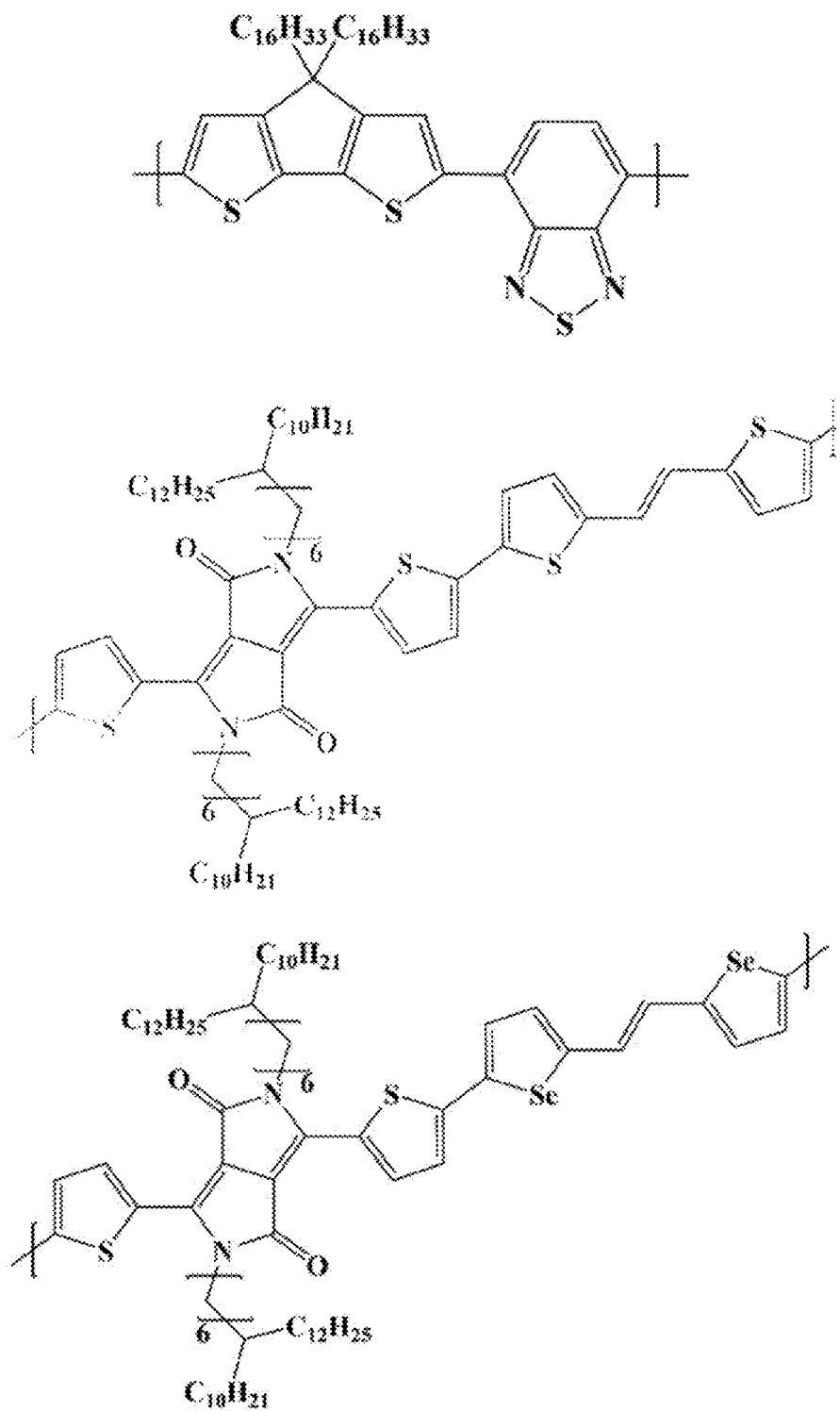

FIG. 10 is a flowchart illustrating a method for fabricating a device according to one or more embodiments of the present invention. The method comprises the following steps.

Block 1000 represents obtaining/providing and/or preparing a substrate. In one or more embodiments, the substrate comprises a flexible substrate. Examples of a flexible substrate include, but are not limited to, a plastic substrate, a polymer substrate, a metal substrate, or a glass substrate. In one or more embodiments, the flexible substrate is at least one film or foil selected from a polyimide film, a polyether ether ketone (PEEK) film, a polyethylene terephthalate (PET) film, a polyethylene naphthalate (PEN) film, a polytetrafluoroethylene (PTFE) film, a polyester film, a metal foil, a flexible glass film, and a hybrid glass film.

Block 1002 represents optionally forming/depositing contacts or electrodes (e.g., p-type, n-type contacts, a gate, a source, and/or drain contacts) on or above (or as part of) the substrate.

In an OFET embodiment comprising a top gate & bottom contact geometry, source and drain contacts are deposited on the substrate. Examples of materials for the source and drain contacts include, but are not limited to, gold, silver, silver oxide, nickel, nickel oxide (NiOx), molybdenum, and/or molybdenum oxide. In one or more embodiments, the source and drain contacts of the OFET further comprise a metal oxide electron blocking layer, wherein the metal in the metal oxide includes, but is not limited to, nickel, silver or molybdenum.

In an OFET embodiment comprising a bottom gate geometry, a gate electrode is deposited on the substrate. In one or more embodiments, the gate contact (gate electrode) is a thin metal layer. Examples of the metal layer for the gate include, but are not limited to, an aluminum layer, a copper layer, a silver layer, a silver paste layer, a gold layer or a Ni/Au bilayer. Examples of the gate contact further include, but are not limited to, a thin Indium Tin Oxide (ITO) layer, a thin fluorine doped tin oxide (FTO) layer, a thin graphene layer, a thin graphite layer, or a thin PEDOT:PSS layer. In one or more embodiments, the thickness of the gate electrode is adjusted (e.g., made sufficiently thin) depending on the flexibility requirement.

The gate, source, and drain contacts can be printed, thermally evaporated, or sputtered, for example.

Block 1004 represents optionally depositing a dielectric on the gate electrode, e.g., when fabricating an OFET in a bottom gate configuration. In this example, the dielectric is deposited on the gate contact's surface to form a gate dielectric.

Examples of depositing the dielectric include forming a coating, a dielectric coating, or one or more dielectric layers on the substrate (and selecting a thickness of the dielectric layers or coating), the layers or coating comprising one or more nanogrooves/nanostructures.

Examples of dimensions for the nanogrooves include, but are not limited to, a nanogroove depth of 6 nanometers or less and/or a nanogroove width of 100 nm or less.

Examples of dielectric layers include a single polymer (e.g., PVP) dielectric layer or multiple dielectric layers (e.g., bilayer dielectric). A single polymer dielectric layer may be preferred in some embodiments (easier processing, more flexible). In one embodiment, the dielectric layers form a polymer/SiO$_2$ bilayer. In another embodiment, the dielectric layers form a polymer dielectric/SiO$_2$/SAM multilayer with the Sift on the polymer and the alkylsilane or arylsilane Self Assembled Monolayer (SAM) layer on SiO$_2$. In yet another embodiment, the dielectric layers form a SiO$_2$/SAM bilayer with the alkylsilane or arylsilane SAM layer on the SiO$_2$. Various functional groups may be attached to the end of the alkyl groups to modify the surface property of the SAM layer.

The thickness of the SiO$_2$ may be adjusted (e.g., made sufficiently thin) depending on the composition of the dielectric layers and the flexibility requirement. For example, in one embodiment, the dielectric layer might not include a polymer dielectric layer and still be flexible.

In one or more embodiments, the nanogrooves/nanostructures are formed/patterned using nano imprint lithography. In one or more examples, fabricating the dielectric layers comprises nano-imprinting a first dielectric layer (e.g., PVP) deposited on a gate metal surface of the substrate; and depositing a second dielectric layer on the nanoimprinted first dielectric layer, wherein a thickness of the second dielectric layer (e.g., comprising SiO$_2$) is adjusted.

Block 1006 represents obtaining/fabricating a semiconducting polymer and a fullerene or electron accepting molecule/compound, and combining the semiconducting polymer with the fullerene or the electron accepting molecule/compound.

In one or more examples, the combining comprises forming a solution comprising a fullerene and the semiconducting polymer, wherein a weight ratio of the fullerene/electron accepting compound/electron acceptors in the solution or in the combination is in a range of 1%-95% wt. % and weight ratio wt. % is defined as $(W_A/(W_A+W_{SP}))\times 100$ where $W_A$ is the weight or mass of the electron acceptor and $W_{SP}$ is the weight or mass of the semiconducting polymer. For example, the weight ratio of electron acceptor/fullerene to the polymer in the solution can be in a range of 1:99 wt. % (i.e., 0.05 mg of fullerene/electron acceptor and 4.95 mg polymer if the solution concentration is 5 mg/ml) to 95:5 wt. % fullerene:polymer. In one or more embodiments, a weight ($W_{SP}$) of the semiconducting polymer added in the solution and a weight ($W_A$) of the fullerene/electron accepting compound/electron acceptors added in the solution are such that $W_{SP}$ is in a range of 5%-99% or 1%-99% of the total weight of the solution including the semiconducting polymers, the electron acceptors, and the solvent.

Examples of the fullerene include a pristine fullerene with the formula of $C_{2n}$ and fullerene derivatives. Examples of pristine fullerenes include, but are not limited to, $C_{60}$, $C_{70}$, $C_{76}$, $C_{78}$, $C_{82}$ and $C_{84}$. Examples of fullerene derivatives include, but are not limited to, a mono-, bis- or tris-functionalized fullerene, $PC_{61}BM$, $PC_{71}BM$, bis-$PC_{61}BM$, bis-$PC_{71}BM$, ICMA, and ICBA. In one example, the fullerene comprises an endohedral fullerene.

In one or more embodiments, the fullerene comprises a mixture of various pristine fullerenes and fullerene derivatives. In one or more embodiments, the pristine fullerene or the fullerene core of the fullerene derivatives comprise heteroatoms (one or more of the carbon atoms in the pristine fullerene, or in the fullerene core of the fullerene derivatives, are substituted by heteroatoms).

Examples of an electron acceptor or electron accepting molecule/compound include any chemical entity that accepts electrons transferred to it from another compound or injected to it from an electrode. The electron transfer process can be either reversible or irreversible. The electron acceptor or electron accepting molecule/compound can be an organic, inorganic or hybrid semiconductor. When the electron transfer is from an electron donor to an electron acceptor, the LUMO energy level of the electron acceptor shall be below the LUMO energy level of the electron donor. The electrons accepted by the electron acceptor or electron accepting molecule/compound can be in their ground state or excited state.

Further examples of electron accepting molecules include, but are not limited to, P(NDI2OD-T2) (polymer acceptor, e.g., Activink™ N2200]), NDI (naphthalene diimide), PDI (perylene diimide), and derivatives of NDI, PDI and N2200.

The mechanism of increasing stability of the thin film transistor using an electron-accepting molecule should be applicable to any type of polymer. Examples of polymers include, but are not limited to, a polymer comprising a DPP unit or a polymer selected from those illustrated in FIGS. 11a-11l.

In one or more examples, the semiconductor polymer is an ambipolar polymer, which is capable of conducting both holes and electrons. Many low bandgap donor-acceptor copolymers show ambipolar charge conduction due to their low-lying LUMO and high-lying HOMO levels.

In one or more examples, the semiconducting polymer comprises a copolymer with donor and acceptor repeating units.

In one or more embodiments of the copolymer, the semiconducting polymer comprises a conjugated main chain section, said conjugated main chain section having a repeat unit that comprises a pyridine of the structure:

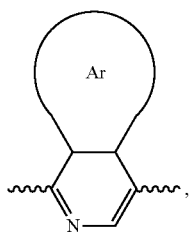

wherein Ar is a substituted or non-substituted aromatic functional group, or Ar is nothing and the valence of the pyridine ring is completed with hydrogen. In one or more embodiments, the pyridine is regioregularly arranged along the conjugated main chain section.

Examples of the pyridine unit include, but are not limited to:

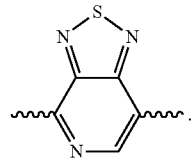

In one or more examples, the repeat unit further comprises a dithiophene of the structure

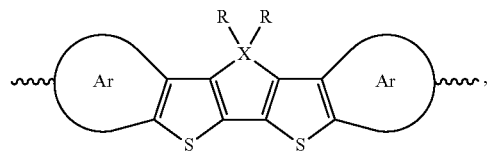

wherein each Ar is independently a substituted or non-substituted aromatic functional group, or each Ar is independently nothing and the valence of its respective thiophene ring is completed with hydrogen, each R is independently hydrogen or a substituted or non-substituted alkyl, aryl or alkoxy chain; and X is C, Si, Ge, N or P. In the dithiophene, the R comprising the substituted or non-substituted alkyl, aryl or alkoxy chain can be a $C_6$-$C_{30}$ substituted or non-substituted alkyl or alkoxy chain, —$(CH_2CH_2O)n$ (n=2~20), $C_6H_5$, —$C_nF_{(2n+1)}$ (n=2~20), —$(CH_2)_nN(CH_3)_3Br$ (n=2~20), 2-ethylhexyl, $PhC_mH_{2m+1}$ (m=1-20), —$(CH_2)_nN(C_2H_5)_2$ (n=2~20), —$(CH_2)_nSi(C_mH_{2m+1})_3$ (m, n=1 to 20), or —$(CH_2)_nSi(OSi(C_mH_{2m+1})_3)_x(C_pH_{2p+1})_y$ (m, n, p=1 to 20, x+y=3). In some embodiments, the R groups in the dithiophene are the same, in other embodiments, the R groups in the dithiophene are different.

Examples of dithiophene units include those illustrated in FIGS. 6b-6d of U.S. patent application Ser. No. 15/349,908 entitled "FLUORINE SUBSTITUTION INFLUENCE ON BENZO[2,1,3]THIODIAZOLE BASED POLYMERS FOR FIELD-EFFECT TRANSISTOR APPLICATIONS," and Table B (FIG. 30B) in U.S. Utility patent application Ser. No. 14/426,467, filed on Mar. 6, 2015, by Hsing-Rong Tseng, Lei Ying, Ben B. Y. Hsu, Christopher J. Takacs, and Guillermo C. Bazan, entitled "FIELD-EFFECT TRANSISTORS BASED ON MACROSCOPICALLY ORIENTED POLYMERS," both of which applications are incorporated by reference herein and cross-referenced above.

In one or more examples, the dithiophene unit comprises:

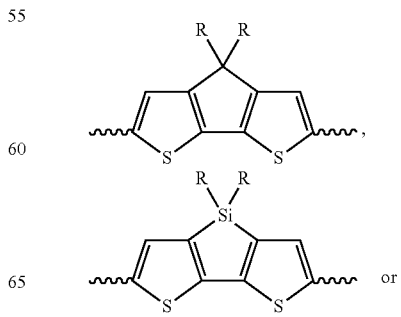

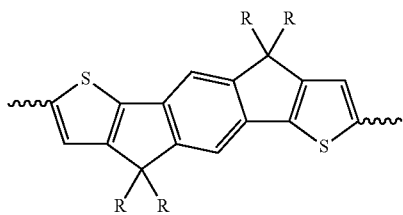

where R is as described above.

In one or more embodiments, the semiconducting polymer has the structure with repeating units D comprising the dithiophene and repeating units A comprising the pyridine, e.g., [D-A-D-A]$_n$, where n is an integer representing the number of repeating units, D is a donor structure, and A is an acceptor structure. In one or more embodiments, the structure has a regioregular conjugated main chain section having 5-150, or more, contiguous repeat units. In some embodiments, the number of repeat units is in the range of 10-40 repeats. The regioregularity of the conjugated main chain section can be 95% or greater, for example. In one or more embodiments, combination of the pyridine and the dithiophene yields the polymer of the formula:

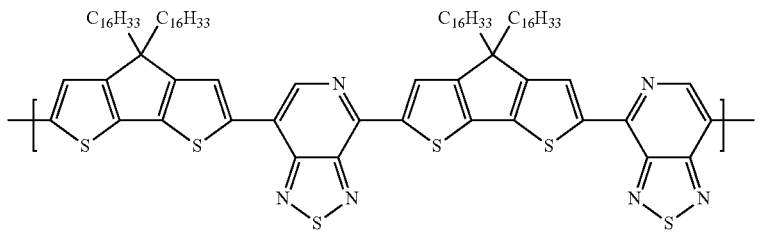

In other examples, the $C_{16}H_{33}$ are replaced with R groups as discussed above.

In one or more further examples, the semiconducting polymer comprises polymer chains having a backbone including an aromatic ring, the aromatic ring comprising a side group (e.g., Fluorine) having reduced susceptibility to oxidization as compared to a pyridine ring.

In one or more embodiments comprising fluorinated conjugated polymer chains, the semiconducting polymer has fluoro functionality such as an acceptor structure including a regioregular fluoro-phenyl unit.

In one or more examples, the semiconducting polymer comprises a conjugated main chain section, the conjugated main chain section having a repeat unit that comprises a compound of the structure:

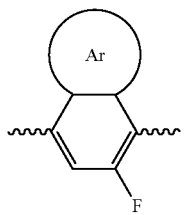

wherein Ar is a substituted or non-substituted aromatic functional group containing one, two, three or more aromatic rings, or Ar is nothing and the valence of the ring comprising fluorine (F) is completed with hydrogen. In one or more embodiments, the ring comprising F is regioregularly arranged along the conjugated main chain section.

In one or more examples, the ring comprising the F has the structure:

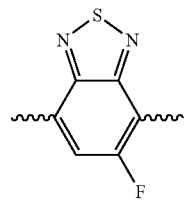

Other examples include those illustrated in FIG. 6a of U.S. patent application Ser. No. 15/349,908 entitled "FLUORINE SUBSTITUTION INFLUENCE ON BENZO[2,1,3] THIODIAZOLE BASED POLYMERS FOR FIELD-EFFECT TRANSISTOR APPLICATIONS," (which application is incorporated by reference herein and cross-referenced above) where each R is independently a substituted or non-substituted alkyl chain, which can be a $C_6$-$C_{30}$ substituted or non-substituted alkyl chain, —(CH$_2$CH$_2$O)n (n=2~20), $C_6H_5$, —$C_nF_{(2n+1)}$ (n=2~20), —(CH$_2$)$_n$N(CH$_3$)$_3$ Br (n=2~20), —(CH$_2$)$_n$N(C$_2$H$_5$)$_2$ (n=2~20), 2-ethylhexyl, PhC$_m$H$_{2m+1}$ (m=1-20), —(CH$_2$)$_n$Si(C$_m$H$_{2m+1}$)$_3$ (m, n=1 to 20), or —(CH$_2$)$_n$Si(OSi(C$_m$H$_{2m+1}$)$_3$)$_x$(C$_p$H$_{2p+1}$)$_y$ (m, n, p=1 to 20, x+y=3), for example; in some embodiments, the R groups attached the ring comprising F are the same, in other embodiments the R groups attached to the ring comprising F are different.

In one or more embodiments, the repeat unit further comprises a dithiophene as described previously.

Thus, in one or more embodiments, the semiconducting polymer is a regioregular semiconducting polymer comprising a repeating unit of the structure:

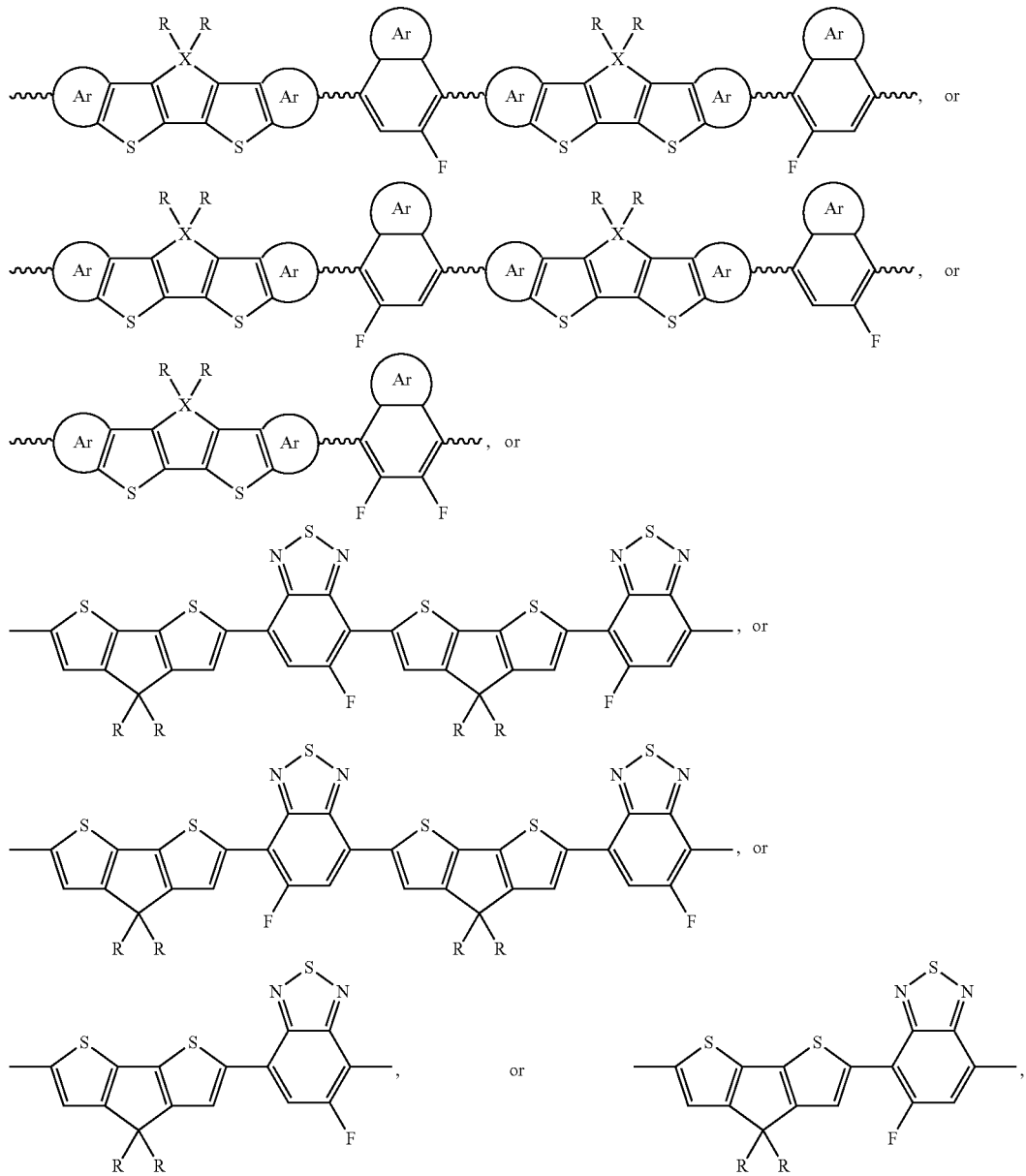

where the ring comprising F is regioregularly arranged along the conjugated main chain section pointing toward the direction shown in the structures above, Ar is a substituted or non-substituted aromatic functional group containing one, two, three or more aromatic rings, or Ar is nothing and the valence of the ring comprising fluorine (F) or the valence of the dithiophene is completed with hydrogen, the R groups comprising the substituted or non-substituted alkyl, aryl or alkoxy chain can be a $C_6$-$C_{30}$ substituted or non-substituted alkyl or alkoxy chain, —$(CH_2CH_2O)n$ (n=2~20), $C_6H_5$, —$C_nF_{(2n+1)}$ (n=2~20), —$(CH_2)_nN(CH_3)_3Br$ (n=2~20), 2-ethylhexyl, $PhC_mH_{2m+1}$ (m=1-20), —$(CH_2)_nN(C_2H_5)_2$ (n=2~20), —$(CH_2)_nSi(C_mH_{2m+1})_3$ (m, n=1 to 20), or —$(CH_2)_nSi(OSi(C_mH_{2m+1})_3)_x(C_pH_{2p+1})_y$ (m, n, p=1 to 20, x+y=3).

For example, the semiconducting polymer can be regioregular poly[5-fluoro-[2,1,3]benzothiadiazole-4,7-diyl(4,4-dihexadecyl-4H-cyclopenta[2,1-b:3,4-b']dithiophene-2,6-diyl)-5-fluoro-[2,1,3]benzothiadiazole-7,4-diyl(4,4-dihexadecyl-4H-cyclopenta[2,1-b:3,4-b']dithiophene-2,6-diyl)] (P2F or PCDTFBT).

In one or more embodiments, the semiconducting polymer comprises PCDTBT of the formula:

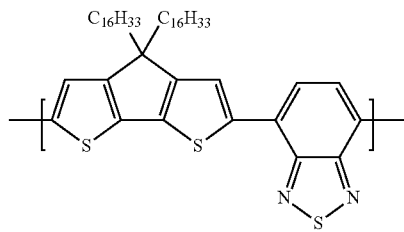

wherein the $C_{16}H_{33}$ can be replaced with R as defined above.

Block 1008 represents solution casting/processing the solution comprising the blends of semiconducting polymer and fullerene/electron accepting molecule. In one or more embodiments, the solution is cast on or above the substrate or on the dielectric (e.g., patterned dielectric) to form a film on the substrate or dielectric.

Solution casting methods include, but are not limited to, inkjet printing, bar coating, spin coating, blade coating, spray coating, roll coating, dip coating, free span coating, dye coating, screen printing, and drop casting.

In one or more embodiments, nanogrooves provide nucleation sites for growth of polymer chains within the solution so that one or more of the polymer chains seed and stack within one or more of the nanogrooves.

Block 1008 can represent one or more solution coating processes, or combination of solution coating, thermal evaporation and sputtering, to form a polymer/fullerene blend, bilayer, or multilayer film.

The semiconducting polymer can comprise polymer chains stacked into one or more fibers. One or more of the nanogrooves can contact and align one or more of the fibers such that the fibers are continuously aligned with (and/or at least partially lie within) one or more of the nanogrooves. The width of an individual fiber can be about 2-3 nm. Fibers on the nanostructured/nanogrooved substrate can form fiber bundles having a width of 50~100 nm (as compared to fiber bundles having a width between 30~40 nm when fabricated on a non-structured substrate).

The polymer chains can each have a main chain axis, each fiber can have a long axis and a short axis, and the main-chain axes can be aligned along the long-axis of the fiber while π-π stacking of the polymer chains can be in a direction along the short-axis of the fiber.

The nanogrooves can provide nucleation sites for growth of the polymer chains within the solution so that one or more of the polymer chains seed and stack within one or more of the nanogrooves.

Block 1010 represents further processing the polymer/fullerene film cast on the substrate (e.g., on the patterned dielectric layers). The step can comprise annealing/curing the film or allowing the film to dry. Annealing/curing the film may be used to adjust/optimize the blends' morphology and phase separation). The step can comprise depositing source and drain contacts, if necessary.

Block 1012 represents the end result, an organic semiconductor device.

Figure 12:
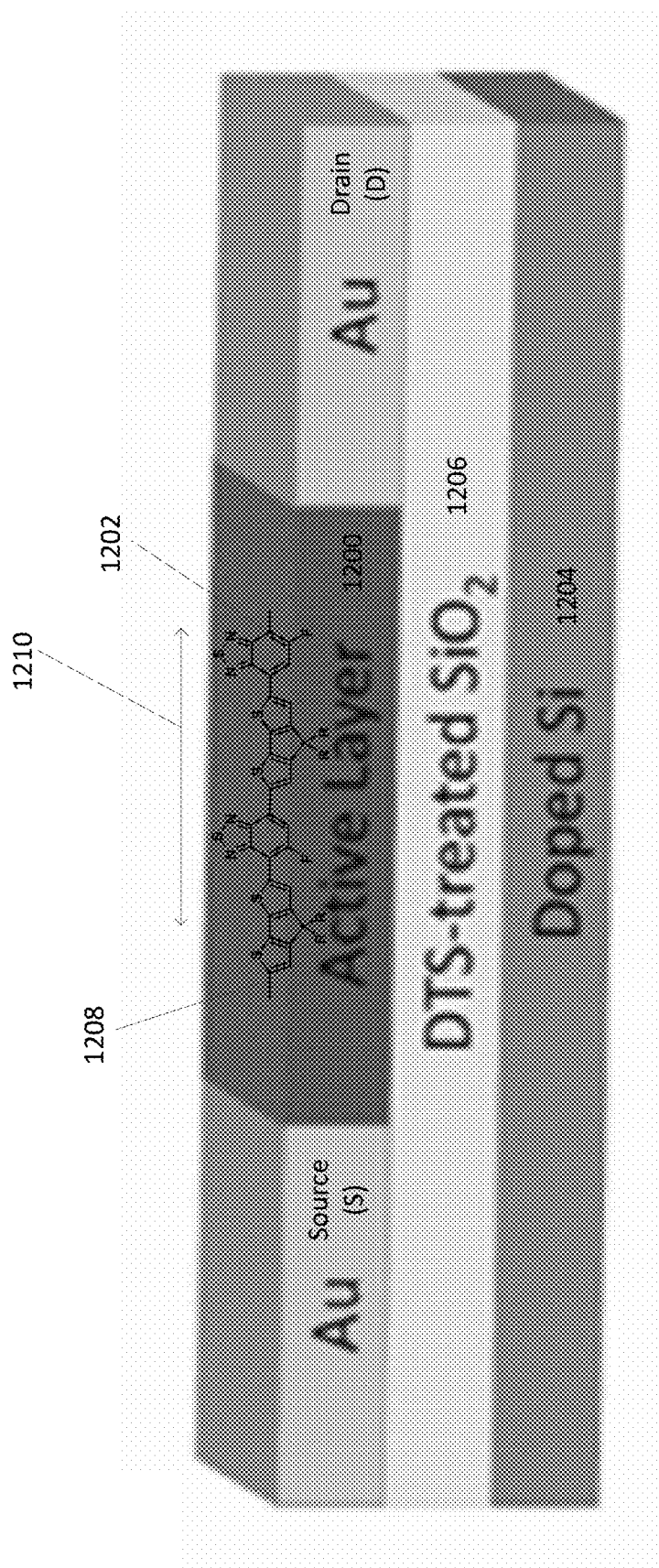
FIG. 12 is a schematic of an OFET according to one or more embodiments of the invention.

In one or more embodiments, the device comprises one or more OFETs or an electronic circuit comprising the OFETs. FIG. 12 illustrates each OFET comprising a source contact S and a drain contact D to a film/active region 1200 comprising the semiconducting polymer 1202 and the electron accepting compound; and a gate connection (doped silicon (Si) 1204) on a dielectric 1206 (e.g., DTS treated $SiO_2$), wherein the gate connection applies a field to the semiconducting polymer 1202 across the dielectric 1206 to modulate conduction along the semiconducting polymer in a channel between the source contact S and the drain contact D.

Embodiments of the present invention are not limited to the particular sequence of depositing the source, drain, and gate contacts. For example, OFETs according to one or more embodiments of the present invention can be fabricated in a bottom gate & top contact geometry, bottom gate & bottom contact geometry, top gate & bottom contact geometry, and top gate & top contact geometry[24].

In one or more embodiments, the OFET comprises means (e.g., grooves, nanogrooves or statutory equivalents thereof) for aligning the main chain axes 1208 of the polymer 1202 to the channel. In one or more embodiments, the semiconductor polymers in the OFET each comprise polymer chains, the polymer chains each having a backbone/main chain axis 1208, the semiconducting polymers stacked in one or more fibers (e.g., each having a width or diameter of 2 nm-3 nm), and the fibers bundled into fiber bundles. Each fiber bundle has a long axis and a short axis, and the main-chain axes are aligned along the long-axis of the fiber while π-π stacking of the polymer chains is in a direction along the short-axis of the fiber. In one or more embodiments, the nanogrooves contact and align one or more of the fibers such that the fibers are continuously aligned with (and/or at least partially lie within) one or more of the nanogrooves. Fibers on the nanostructured/nanogrooved substrate can form fiber bundles having a width of 50~100 nm (as compared to fiber bundles having a width between 30~40 nm when fabricated on a non-structured substrate).

In one or more embodiments, the semiconducting polymers comprise aligned conjugated polymer chains stacked to form a crystalline structure, the polymer chains oriented with an orientational order parameter between 0.9 and 1.

The nanogrooves align the semiconducting polymers such that conduction between the source contact and the drain contact is predominantly along the backbones/main chain axes substantially parallel to a longitudinal axis of at least one of the nanogrooves, although charge hopping between adjacent polymers in a fiber bundle is also possible. For example, the means can align the main chain axes to an imaginary line bounded by the source and the drain or the means can align the main chain axes 1208 to an alignment direction 1210 in the channel between Source S and Drain D. The source and drain can be positioned such that a minimum distance between the source contact and drain contact is substantially parallel to the longitudinal axis of the nanogrooves.

In one or more embodiments, the dielectric layer is patterned with the nanogrooves that orient the semiconducting polymers.

In other embodiments, means for aligning the semiconducting polymers comprises a fabrication method, including, but not limited to, blade coating, dip coating, and bar coating (or statutory equivalents thereof) of the semiconducting polymers on dielectric/substrate.

In one or more embodiments, the source, the drain, the gate, and dielectric have one or more compositions, structures, or configurations, the semiconducting polymer has a structure (including regioregularity), composition and weight/amount, the fullerene/electron accepting molecule has a composition and weight/amount, the film has a quality (including crystallinity) and morphology, the solvent for the solution has a composition, and the OFETs, semiconducting polymer, and fullerene are fabricated/processed under conditions described herein, such that:

each of the OFETs are characterized by having a curve plotting $(I_d)^{1/2}$ as a function of gate voltage $(V_g)$, the curve having a single slope for $V_g$ in a range of 10 V to −60 V and for $(I_d)^{1/2}$ of 0.012 or less (or for a source drain voltage of −80 V);

each of the OFETs are characterized by their drain-source current $(I_{ds})$ for a given gate voltage $(V_g)$ changing by 10% or less after 20 sweeps of the $V_g$ in a range of 10 V to −60 V (i.e., a current voltage curve having reduced variation/hysteresis after multiple sweeps of the gate voltage);

the OFET has a (e.g., hole or electron) mobility in a saturation regime of at least 2 cm$^2$ V$^{-1}$ s$^{-1}$;

the OFET has a mobility in a saturation regime that is not reduced by more than 30% after the 20 sweeps of the gate voltage in a range of 10 V to −60 V; and/or the OFET has a threshold voltage that does not shift by more than 1 Volt after the 20 sweeps of the gate voltage in a range of 10 V to −60 V.

Thus, it is unexpectedly found that an amount of the electron accepting molecule/compound (e.g., fullerene) can be controlled in order to control and obtain a desired threshold voltage, mobility, ideality, and/or stability (including a stability over time and cycling stability) of the OFET, to achieve the results described herein. An ordinarily skilled artisan may not predict the unexpected and surprising increase in threshold voltage stability and current-voltage curve stability represented by the results described herein and achieved by one or more embodiments of the present invention.

While the exceptional properties of PC$_{61}$BM or C$_{60}$ as an electron acceptor clearly suppress instability and non-idealities, the exact mechanism is not entirely understood. Due to PC$_{61}$BM's high electron affinity, it is reasonable that any injected electrons ultimately are located in the fullerene instead of the polymer. Moreover, without being bound to a particular scientific theory, examination of the film morphology leads the inventors of the present invention to propose a possible requirement for the observed operational enhancement: that the polymers are interconnected to maintain hole transport and that the additive phase (e.g., the fullerene or electron accepting compound) either be of low mobility or not interconnected to inhibit electron transport. Despite uncertainties in percolation on the length scale of the devices, that μ is unperturbed across all concentration of PC$_{61}$BM indicates that an interconnected polymer phase favorable for hole transport exists under all conditions.

Possible Modifications and Variations

Although the polymer-fullerene composition is incorporated into OFETs, the high mobility composition comprising the semiconducting polymer and fullerene could be included other high mobility systems (e.g., light emitting diodes).

In one or more embodiments, the organic semiconductor device of Block 1012 comprises a composition of matter useful as a current transport region in the organic semiconductor device, the composition of matter comprising one or more semiconducting polymers; and means for accepting electrons from the semiconducting polymers or accepting electrons injected into the current transport region (and statutory equivalents thereof). In one or more embodiments, the means comprise an electron accepting compound.

Examples of the means include, but are not limited to, a fullerene, a fullerene derivative, P(NDI2OD-T2) (polymer acceptor, e.g., Activink™ N2200]), NDI (naphthalene diimide), PDI (perylene diimide), small molecule or polymer derivatives of NDI, PDI and N2200, a statutory equivalent thereof, or a compound having a similar electron accepting structure/property as a fullerene.

In one or more embodiments, the means for accepting electrons are electron accepting compounds useful as a current and/or threshold voltage stabilizing agent in the organic semiconductor device.

In one or more embodiments, the means accept electrons injected into the current transport region of the device, thereby impeding conduction of the electrons in the one or more semiconducting polymers. An effective amount of an electron accepting compound can be incorporated into the current transport region of the device in order to impede the conduction and/or suppress current and voltage instability to a desired/threshold level.

In one or more embodiments, and without being bound by any particular scientific theory:

the electron accepting compound scavenges electron charge and/or blocks electron charge from being injected into the semiconducting polymer (wherein the electron charge is injected from external circuitry applying voltages, e.g., source drain voltages applied across the source and drain, and/or gate voltage applied to the gate contact);

the electron accepting compound can receive electrons from the semiconducting polymer and prevent the electrons from returning to the semiconducting polymer;

the OFET/device comprises a SiO$_2$ gate dielectric layer, and the electron accepting compound accepts electrons formed on the SiO$_2$ dielectric layer due to exposure of the SiO$_2$ dielectric layer to environmental conditions (such as moisture), thereby impeding the electron charge from reaching the semiconducting polymer, and/or maintaining a constant electric field imposed by the gate voltage; and the electron accepting compound in the film or active region comprises multiple domains electrically insulated from one another such that conduction of electrons between the domains is hindered, impeded, or prevented.

Advantages and Improvements

OFETs have garnered attention since the solution processability of the semiconductor raises the possibility of lower device fabrication costs, and considerable progress has been made on achieving high mobility systems. Much progress has been made on obtaining high mobilities, which suggests future commercial viability. However, device stability remains an issue. Some systems display instability in the current and mobility whereby normal operational stresses undesirably and temporarily impact device performance. Quality control would require device stability under normal operating conditions.

Here, one or more embodiments of the invention outline a method of fabricating devices that include an electron-accepting molecule or additive (e.g., a fullerene such as PC$_{61}$BM or C$_{60}$) that inhibits the mechanism that causes device instability. The present disclosure shows how the additive improves device characteristics/stability (such as ideality cycling stability, and temporal stability) for OFET devices comprising PCDTPT, DT-PDPPTT-DT, PCDTFBT, or PCDTBT. More specifically, the present disclosure reports on the observation of suppression of the double-slope in the $I_d^{1/2}$ vs. $V_g$ plots, improved $I_{ON}/I_{OFF}$, and stable $V_T$ and μ by using a fullerene additive with ambipolar polymer semiconductors. Moreover, Fullerene addition converts ambipolar charge transport to p-type only, regardless of the dielectric layer.

These results provide a convenient route to direct the choice of charge carrier and to stabilize device function. The fact that the present invention's method of adding an electron acceptor has been applied to a variety of polymeric semiconductors opens various avenues of research to explore the effects of morphology, investigate different combinations of donor and acceptor semiconductors, and to explore how the choice of components and the morphology in multicomponent p-/n-type semiconductor blends impact charge transport characteristics. Continuous bias-sweeping and bias-stressing of polymer the blends are consistent with injected electrons ultimately residing on the fullerenes. The inventors' current thinking is that under dilute fullerene conditions, electrons are impeded from transport because of their localization in fullerene sites that cannot form a percolated network between electrodes. When the concentration of fullerene is higher, electron transport may not be as high relative to the polymer-only situation because of a lower intrinsic electron μ in the fullerene phase due to electron trapping (consistent with previous results for other polymer semiconductor:fullerene blends used for organic photovoltaics[29]), but further work to confirm this scenario in the blends studied here should be considered. Despite that mechanistic uncertainties will require additional characterization tools, that the hole μ is unperturbed indicates a continuous polymer phase present under all conditions that enables hole transport in the channel. By varying the electron affinity and LUMO offset, device characteristics are stabilized under a variety of stressing conditions. With the most stable PCDTBT:PC$_{61}$BM blends, devices can be subjected to V$_g$ as high as 100 V and cycled for up to 14.5 hours without significant changes in performance and achieve μ greater than 5 cm$^2$ V$^{-1}$ s$^{-1}$.

Not only do the present disclosure's results illustrate a convenient route for producing improved p-type OFETs, but the facile method of using the additive to improve stability of the high mobility transistors would be useful for a variety of commercial applications. Indeed, the inventors believe that the use of the additive is a significant step forward for high μ p-type semiconductors that are promising for implementation into consumer-ready electronic devices. For example, polymer-based OFETs according to one or more embodiments of the present invention have potential applications in flexible and low-cost electronics including applications with light emitting diodes and liquid crystal displays.

Further information on one or more embodiments of the present invention can be found in "Fullerene Additives Convert Ambipolar Transport to p-Type Transport while Improving the Operational Stability of Organic Thin Film Transistors," by Michael J. Ford, Ming Wang, Hung Phan, Thuc-Quyen Nguyen, and Guillermo Bazan, Advanced Functional Materials, Volume 26, Issue 25, Jul. 5, 2016, Page 4616[22] and the Supporting Information[23].

REFERENCES

The following references are incorporated by reference herein:

[1] Tsao, H. et al. Ultrahigh mobility in polymer field-effect transistors by design. *J. Am. Chem. Soc.* 133, 2605-2612 (2011).

[2] Giri, G. et al. Tuning charge transport in solution-sheared organic semiconductors using lattice strain. *Nature.* 480, 504-508 (2011).

[3] Sirringhaus, H. 25$^{th}$ anniversary article: organic field-effect transistors: the path beyond amorphous silicon. *Adv. Mater.* 26, 1319-1335 (2014).

[4] Li, J. et al. A stable solution-processed polymer semiconductor with record high-mobility for printed transistors. *Sci. Rep.* 133, 754-764 (2012).

[5] Kang, I. et al. Record high hole mobility in polymer semiconductors via side-chain engineering. *J. Am. Chem. Soc.* 135, 14896-14899 (2013).

[6] Sirringhaus, H. Reliability of organic field-effect transistors. *Adv. Mater.* 21, 3859-3863 (2009).

[7] Bobbert, P. A., Sharma, A., Mathijsse, S. G. J. Kemerink, M., & de Leeuw, D. M. Operational stability of organic field-effect transistors. *Adv. Mater.* 24, 1146-1158 (2012).

[8] Minemawari, H. et al. Inkjet printing of single-crystal films. *Nature* 475, 364-367 (2014).

[9] Venkateshvaran, D. et al. Approaching disorder-free transport in high-mobility conjugated polymers. *Nature* 515, 384-388 (2014).

[10] Nketia-Yawson, B. et al. A highly planar fluorinated benzothiadazole-based conjugated polymer for high-performance organic thin-film transistors. *Adv. Mater.* 27, 3045-3052 (2015).

[11] Kim, G. et al. A thienoisoindigo-napthalene polymer with ultrahigh mobility of 14.4 cm$^2$/V s that substantially exceeds benchmark values for amorphous silicon semiconductors. *J. Am. Chem. Soc.* 136, 9477-9483 (2014).

[12] Lee, J. et al. Boosting the ambipolar performance of solution-processable polymer semiconductors via hybrid side-chain engineering. *J Am. Chem. Soc.* 135, 9540-9547 (2013).

[13] Sonar, P. Hole mobility of 3.56 cm$^2$ V$^{-1}$ s$^{-1}$ accomplished using more extended dithienothiophene with furan flanked diketopyrrolopyrrole polymer. *J. Chem. Mater. C.* 3, 9299-9305 (2015).

[14] Han, A. et al. ε-branched flexible side chain substituted diketopyrrolopyrrole-containing polymers designed for high hole and electron mobilities. *Adv. Funct. Mater.* 25, 247-254 (2015).

[15] Ying, L. et al. Regioregular pyridal[2,1,3]thiadiazole π-conjugated copolymers. *J Am. Chem. Soc.* 133, 18538-18541 (2011).

[16] Tseng, H. et al. High mobility field effect transistors based on macroscopically oriented regioregular copolymers. *Nano Lett.* 12, 6353-6357 (2012).

[17] Tseng, H. et al. High-mobility field-effect transistors fabricated with macroscopic aligned semiconducting polymers. *Adv. Mater.* 26, 2993-2998 (2014).

[18] Luo, C. et al. General strategy for self-assembly of highly oriented nanocrystalline semiconducting polymers with high mobility. *Nano Lett.* 14, 2764-2771 (2014).

[19] Ford, M. et al., High Mobility Organic Field-Effect Transistors from Majority Insulator Blend Solutions. *Submitted to Chem. Mater.*

[20] Phan, H., Wang, M, Bazan, G. C., Nguyen, T. C. Electrical instability induced by electron trapping in low-bandgap donor-acceptor polymer field-effect transistors. *Adv. Mater.* 27, 7004-7009 (2015).

[21] Li, W., et al. Efficient small bandgap polymer solar cells with high fill factors for 300 nm thick films. *Adv. Mater.* 25, 3182-3186 (2013).

[22] Fullerene Additives Convert Ambipolar Transport to p-Type Transport while Improving the Operational Stability of Organic Thin Film Transistors, by Michael J. Ford, Ming Wang, Hung Phan, Thuc-Quyen Nguyen, and Guillermo Bazan, Advanced Functional Materials, Volume 26, Issue 25, Jul. 5, 2016, Page 4616.

[23] "Supporting Information" for reference 22 entitled. Fullerene Additives Convert Ambipolar to p-Type Transport while Increasing the Operational Stability of Organic Thin Film Transistors, by Michael J. Ford, Ming Wang, Hung Phan, Thuc-Quyen Nguyen, Guillermo C. Bazan.

[24] DiBenedetto et. al., Molecular Self-Assembled Monolayers and Multilayers for Organic and Unconventional Inorganic Thin-Film Transistor Applications, Adv. Mater. 2009, 21, 1407-1433 DOI 10.1002/adma.200803267.

[25] Wang, M., Ford, M., Phan, H., Coughlin, J., Nguyen, T. Q., Bazan, G. C. *Chem. Commun.* 2016, 52, 3207.

[26] Larson, B. W., Whitaker, J. B., Wang, X. B., Popov, A. A., Rumbles, G., Kopidakis, N., Strauss, S. H., Boltalina, O V. *J. Phys. Chem. C.,* 2013, 117 14958.

[27] Lenes, M., Wetzelaer, G. A. H., Kooistra, F. B., Veenstra, S. C., Hummelen, J. C., Blom, P. W. M. *Adv. Mater.* 2008, 20, 2116.

[28] Cowan, S. R., Leong, W. L., Banerji, N., Dennler, G., Heeger, A. J. *Adv. Funct. Mater.* 2011, 21, 3083.

[29] Bartlet, J. A., Beiley, Z. M., Hoke, E. T., Mateker, W. R., Douglas, J. D., Collins, B. A., Tumbleston, J. R., Graham, K. R., Amassian, A., Ade, H., Fréchet, J. M. J., Toney, M. F., McGehee, M. D. *Adv. Energy Mater.* 2013, 3, 364.

[30] Review: Fullerene based acceptors for efficient bulk heterojunction organic solar cell applications, Ramasamy Ganesamoorthy et. al., Solar Energy Materials & Solar Cells 161 (2017) 102-148.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. One or more organic field effect transistor (OFET)s, comprising:
    semiconducting polymers combined with electron acceptors so as to change an ambipolar transport of the semiconducting polymers to p-type transport;
    a source contact to a p-type channel including the semiconducting polymers;
    a drain contact to the p-type channel; and
    a dielectric between a gate contact and the p-type channel.

2. The OFETs of claim 1, wherein the semiconducting polymers comprise polymer chains each comprising donor-acceptor repeating units.

3. The OFETs of claim 1, wherein the semiconducting polymers comprise polymer chains each comprising regio-regular donor-acceptor repeating units.

4. The OFETs of claim 1, wherein the electron acceptors are current stabilizing agents.

5. The OFETs of claim 1, wherein each of the electron acceptors are fullerenes.

6. The OFETs of claim 5, wherein:
    each of the OFETs further comprise a film,
    the film is cast from a solution comprising the fullerenes and the semiconducting polymers,
    a weight ratio of the fullerene in the film is in a range of 1%-95% wt. %, and
    the weight ratio is defined as $(W_F/(W_F+W_{SP}))\times 100$, wherein $W_F$ is the weight of the fullerene in the film and $W_{SP}$ is the weight of the semiconducting polymers in the film.

7. The OFETs of claim 5, wherein:
    each of the OFETs each comprise a film;
    the fullerenes are phase separated in the film;
    the electron acceptors are either of low mobility or are not interconnected so as to inhibit electron transport in the p-type channel; and
    the semiconducting polymers include a plurality of interconnected polymer chains.

8. The OFETs of claims 5, wherein each of the fullerenes comprise $PC_{61}BM$.

9. The OFETs of claim 1, wherein each of the electron acceptors comprise at least one compound selected from $PC_{61}BM$, $PC_{71}BM$, $C_{60}$, N2200, an N2200 derivative, naphthalene diimide (NDI), an NDI derivative, perylene diimide (PDI), and a PDI derivative.

10. The OFETs of claim 1, further comprising:
    a first amount and a first composition of the semiconducting polymers;
    a second amount and a second composition of the electron acceptors;
    wherein each of the OFETs are characterized by having a curve plotting $(I_d)^{1/2}$ as a function of gate voltage $(V_g)$, the curve having a single slope for $V_g$ in a range of 10 V to -60 V and $(I_d)^{1/2}$ of 0.012 or less.

11. The OFETs of claim 1, further comprising:
    a first amount and a first composition of the semiconducting polymers;
    a second amount and a second composition of the electron acceptors;
    wherein each of the OFETs are characterized by their drain-source current $(I_{ds})$ for a given gate voltage $(V_g)$ changing by 10% or less after 20 sweeps of the $V_g$ in a range of 10 V to -60 V.

12. The OFETs of claim 1, further comprising:
    a first amount and a first composition of the semiconducting polymers;
    a second amount and a second composition of the electron acceptors; and
wherein each of the OFETs have a mobility in a saturation regime of at least 2 $cm^2$ $V^{-1}$ $s^{-1}$.

13. The OFETs of claim 1, further comprising:
    a first amount and a first composition of the semiconducting polymers;
    a second amount and a second composition of the electron acceptors;
    wherein the OFETs each have the mobility in a saturation regime that is not reduced by more than 30% after 20 sweeps of the gate voltage in a range of 10 V to -60 V.

14. The OFETs of claim 1, further comprising:
    a first amount and a first composition of the semiconducting polymers;
    a second amount and a second composition of the electron acceptors;
wherein the OFETs each have a threshold voltage that does not shift by more than 1 Volt after 20 sweeps of the gate voltage in a range of 10 V to -60 V.

15. The OFETs of claim 1, wherein the semiconducting polymers comprise a plurality of polymer chains each comprising a regioregular conjugated main chain section, said regioregular conjugated main chain section having a repeat unit that comprises a compound of the structure:

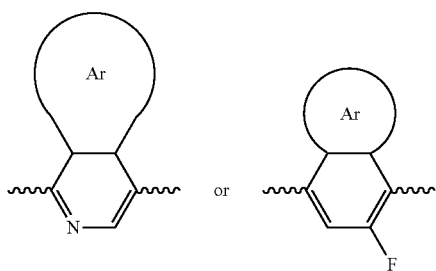

wherein:
Ar is a substituted or non-substituted aromatic functional group or Ar is hydrogen;
the pyridine or the fluorinated ring is regioregularly arranged along the conjugated main chain section; and
the compound is bonded, in the repeat unit, to a dithiophene of the structure:

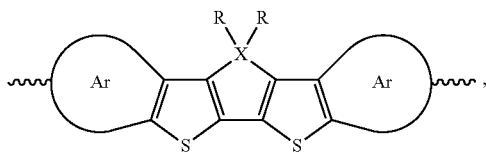

wherein each R is independently hydrogen or a substituted or non-substituted alkyl, aryl or alkoxy chain; and X is C, Si, Ge, N or P.

16. The OFETs of claim 1, wherein the semiconducting polymer is:
poly[4-(4,4-dihexadecyl-4H-cyclopenta[1,2-b:5,4-b']dithiophen-2yl)-alt-[1,2,5]thiadiazolo[3,4-c]pyridine] (PCDTPT), or
poly[5-fluoro-[2,1,3]benzothiadiazole-4,7-diyl(4,4-dihexadecyl-4H-cyclopenta[2,1-b:3,4-b']dithiophene-2,6-diyl)-5-fluoro-[2,1,3]benzothiadiazole-7,4-diyl(4,4-dihexadecyl-4H-cyclopenta[2,1-b:3,4-b']dithiophene-2,6-diyl)] (PCDTFBT).

17. A method of fabricating an organic field effect transistor (OFET),
providing semiconducting polymers combined with electron acceptors so as to change an ambipolar transport of the semiconducting polymers to p-type transport;
providing a source contact to a channel comprising the semiconducting polymers;
providing a drain contact to the channel; and
providing a dielectric between a gate contact and the channel.

18. The method of claim 17, further comprising:
forming the OFET on a substrate;
solution processing the semiconducting polymers and the electron acceptors from a solution onto the substrate, wherein:
each of the electron acceptors comprise a fullerene and a concentration of the fullerenes in the solution is in a range of 1%-95% wt. %, and
the semiconducting polymers comprise a regioregular donor-acceptor backbone.

19. The field effect transistor of claim 1, wherein:
the semiconducting polymers comprise interconnected polymer chains and are phase separated from the electron acceptors, and
the electron acceptors are either of low mobility or are not interconnected so as to inhibit electron transport in the p-type channel.

20. The field effect transistor of claim 1, wherein:
the semiconducting polymers comprise interconnected polymer chains and are phase separated from the electron acceptors, and
the electron acceptors are not interconnected so as to inhibit electron transport in the p-type channel.

* * * * *